United States Patent
Lee et al.

(10) Patent No.: US 11,528,815 B2
(45) Date of Patent: Dec. 13, 2022

(54) DISPLAY DEVICE AND DISPLAY SYSTEM HAVING THE SAME

(71) Applicant: SAMSUNG ELECTRONICS CO., LTD., Suwon-si (KR)

(72) Inventors: Jaeneung Lee, Suwon-si (KR); Soodsuk Seo, Seoul (KR); Chulyong Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 247 days.

(21) Appl. No.: 16/879,056

(22) Filed: May 20, 2020

(65) Prior Publication Data
US 2020/0375041 A1    Nov. 26, 2020

(30) Foreign Application Priority Data

May 20, 2019   (KR) ........................ 10-2019-0058631

(51) Int. Cl.
| | |
|---|---|
| F16B 1/00 | (2006.01) |
| H05K 5/00 | (2006.01) |
| F16M 11/04 | (2006.01) |
| F16M 13/02 | (2006.01) |
| H01F 7/20 | (2006.01) |
| H05K 5/02 | (2006.01) |

(52) U.S. Cl.
CPC ............ *H05K 5/0017* (2013.01); *F16B 1/00* (2013.01); *F16M 11/041* (2013.01); *F16M 13/022* (2013.01); *H01F 7/20* (2013.01); *H05K 5/0208* (2013.01)

(58) Field of Classification Search
None
See application file for complete search history.

(56) References Cited

U.S. PATENT DOCUMENTS

| | | | |
|---|---|---|---|
| 9,839,145 B2 | 12/2017 | Ryu et al. | |
| 10,495,255 B2 * | 12/2019 | Brashnyk | ............. F16M 13/022 |
| 10,522,519 B2 * | 12/2019 | Ryu | ...................... G09F 9/3026 |
| 10,653,021 B2 * | 5/2020 | Kim | ...................... G09F 9/3026 |

(Continued)

FOREIGN PATENT DOCUMENTS

| | | |
|---|---|---|
| JP | 9-63214 | 3/1997 |
| JP | 2016-142861 A | 8/2016 |
| WO | WO 2016/109439 | 7/2016 |

OTHER PUBLICATIONS

International Search Report dated Sep. 11, 2020, in corresponding International Patent Application No. PCT/KR2020/006505.

(Continued)

*Primary Examiner* — Xanthia C Cunningham
(74) *Attorney, Agent, or Firm* — Staas & Halsey LLP

(57) ABSTRACT

Provided is a display device including at least one display assembly including a display module having a display panel displaying a screen in a first direction, and a supporter magnetically coupled with the display module and supporting the display module; wherein the display module includes a rotating magnet engaged with external magnetic force and rotated in a second direction perpendicular to the first direction, and an adjustment member engaged with rotation of the rotating magnet and translated in the first direction or a third direction opposite the first direction.

20 Claims, 16 Drawing Sheets

(56) References Cited

U.S. PATENT DOCUMENTS

| | | | |
|---|---|---|---|
| 10,667,414 B2* | 5/2020 | Kim | H01F 7/20 |
| 11,184,986 B2* | 11/2021 | Heo | H05K 5/0008 |
| 2003/0056413 A1* | 3/2003 | Wiemer | G09F 7/00 |
| | | | 40/605 |
| 2012/0158187 A1 | 6/2012 | Shin | |
| 2015/0055279 A1* | 2/2015 | McBroom | B25B 23/12 |
| | | | 361/679.01 |
| 2016/0210886 A1* | 7/2016 | Brashnyk | F16M 11/041 |
| 2017/0114971 A1* | 4/2017 | Cross | G09G 5/14 |
| 2017/0292685 A1 | 10/2017 | Patterson et al. | |
| 2019/0037712 A1* | 1/2019 | Kim | H05K 5/0204 |
| 2019/0059166 A1 | 2/2019 | Habeck | |

OTHER PUBLICATIONS

Extended European Search Report dated Oct. 7, 2020, in corresponding European Patent Application No. 20172594.2.
Office Action dated Apr. 6, 2022 issued in Indian Application No. 202117052236.

* cited by examiner

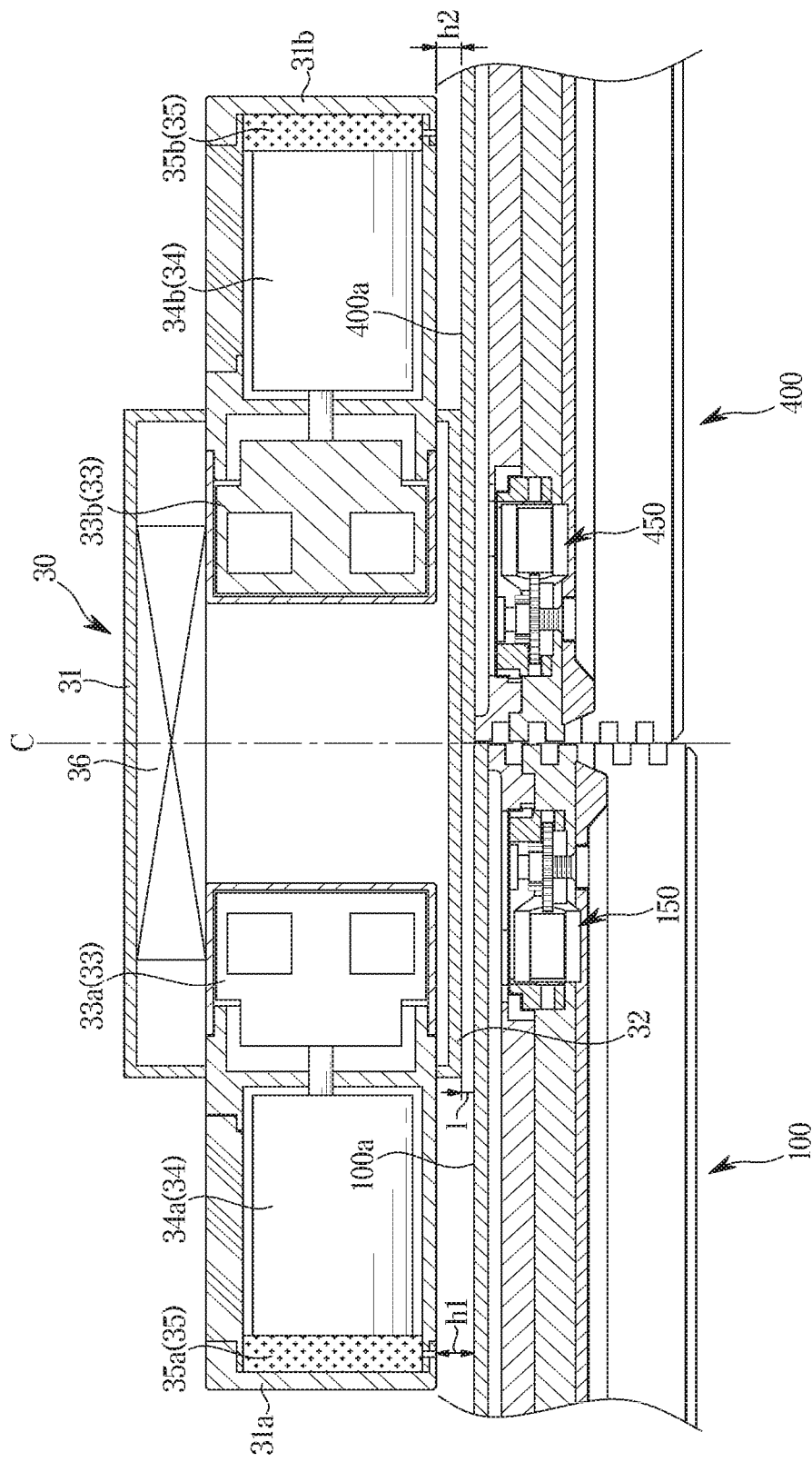

DISPLAY DEVICE AND DISPLAY SYSTEM HAVING THE SAME

CROSS-REFERENCE TO RELATED APPLICATION

This application is based on and claims priority under 35 U.S.C. § 119 to Korean Patent Application No. 10-2019-0058631 filed on May 20, 2019, the disclosure of which is incorporated herein by reference in its entirety.

BACKGROUND

1. Field of the Invention

The disclosure relates to a display device, and more particularly, to a display device including at least one display assembly and a display system including the display device.

2. Discussion of Related Art

Display devices are a kind of output device for visually presenting data information such as characters, figures, etc., and still or video images.

There is a growing interest these days in a display device including a plurality of display assemblies. The display device may provide a large screen by putting the plurality of display assemblies together. Each of the plurality of display assemblies may display a separate screen or a portion of a whole screen.

With the plurality of display assemblies put together, there may be a difference in front level between display panels of the neighboring display assemblies, which may lead to a problem with screen quality of the entire display device.

To prevent this, the display panels of the neighboring display assemblies need to be aligned at the same level by adjusting their height, but fine level alignment between the display panels requires a lot of time, causing difficulty in installation.

SUMMARY OF THE INVENTION

The disclosure provides a display device having an improved structure to allow easy alignment of front levels of a plurality of display assemblies.

The disclosure also provides a display system including a level adjustment device to easily align the front levels of a plurality of display assemblies easier.

In accordance with an aspect of the disclosure, a display device includes at least one display assembly including a display module having a display panel displaying a screen in a first direction, and a supporter magnetically coupled with the display module and supporting the display module, wherein the display module comprises a rotating magnet interlocking with external magnetic force and rotated about a rotation axis extending in a second direction perpendicular to the first direction, and an adjustment member engaged with rotation of the rotating magnet and translated in the first direction or a third direction opposite the first direction.

The display module may be detachably coupled to the supporter in the first direction, and the display module may further include a coupling magnet provided to magnetically couple the display module to the supporter.

When the adjustment member is moved in the third direction, the adjustment member may push the supporter to the third direction such that distance between the display module and the supporter increases.

The display module may include a worm gear transmitting rotational force of the rotating magnet to the adjustment member, the worm gear may include a worm rotated along with the rotating magnet around the rotation axis extending in the second direction, and a worm wheel interlocked with the worm and rotated around a rotation axis extending in the first direction, and the adjustment member may be rotationally coupled with the worm wheel around the rotation axis extending in the first direction.

The worm wheel may be engaged and rotated with the worm when the rotating magnet is rotated, and the adjustment member may be moved in the first direction or the third direction while being engaged with rotation of the worm.

The adjustment member may be moved in the first direction when the second rotating magnet is rotated in one direction, and the adjustment member may be moved in the third direction when the second rotating magnet is rotated in the opposite direction.

The worm wheel may include a center portion provided on the rotation axis of the worm wheel, and teeth extending from the center portion and formed along a circumferential direction of the worm wheel, and the adjustment member may be rotationally inserted into the center portion.

The center portion may include an insertion hole to which the adjustment member is inserted, and first threads formed on an inner circumferential surface of the insertion hole, and the adjustment member may include a body inserted to the insertion hole, and second threads formed on an outer circumferential surface of the body to correspond to the first threads.

The display module may further include a supporting frame having a surface supporting the display panel, and the rotating magnet and the adjustment member may be arranged on an opposite surface of the supporting frame.

The display module may further include a cover frame covering a rear side of the supporting frame, and coming into contact with the supporter when the display module is coupled with the supporter, and the adjustment member may be provided to pass through the cover frame and push the supporter to the third direction when moved in the third direction.

In accordance with another aspect of the disclosure, a display system includes a display device including at least one display assembly including a display module having a display panel displaying a screen in a first direction, and a supporter magnetically coupled with the display module and supporting the display module; and a level adjustment device configured to adjust a level of the at least one display assembly in the first direction, wherein the level adjustment device comprises a first rotating magnet rotated about a rotation axis extending in a direction perpendicular to the first direction when placed in front of the display panel in the first direction, and wherein the display module comprises a second rotating magnet engaged with the first rotating magnet and rotated in a second direction perpendicular to the first direction, and an adjustment member engaged with rotation of the second rotating magnet and translated in the first direction or a third direction opposite the first direction.

The display module may be detachably coupled to the supporter in the first direction, the display module may further include a coupling magnet transmitting magnetic force to the supporter in the first direction to be magnetically coupled to the supporter, and the first rotating magnet may transmit magnetic force to the second rotating magnet clockwise or counterclockwise around the second direction.

The level adjustment device may further include a motor configured to rotate the first rotating magnet and a switch configured to control driving of the motor.

The level adjustment device may further include a stand placed on a corner of the display panel in the first direction to place the level adjustment device at the corner of the display panel in the first direction.

The display module may further include a worm gear transmitting rotational force of the second rotating magnet to the adjustment member, the worm gear may include a worm rotated along with the second rotating magnet around a rotation axis extending in the second direction, and a worm wheel interlocked with the worm and rotated around a rotation axis extending in the first direction, and the adjustment member may be rotationally coupled with the worm wheel around the rotation axis extending in the first direction.

The worm wheel may be engaged and rotated with the worm when the rotating magnet is rotated, and the adjustment member may be moved forward or backward in the first direction or the third direction while being engaged with rotation of the worm.

The level adjustment device may be moved in the first direction for the adjustment member to be inserted into the display module when the rotating magnet is rotated in one direction, and the level adjustment device may be moved in the third direction for the adjustment member to protrude out of the display module when the rotating magnet is rotated in the opposite direction.

The level adjustment device may include a range sensor configured to measure a distance between the display panel and the level adjustment device, and a controller configured to rotate the first rotating magnet when values measured by the range sensor are different.

The at least one display assembly may include a first display assembly and a second display assembly arranged to be adjacent to the first display assembly in a direction perpendicular to the first direction, the range sensor may measure distances from the range sensor to the first and second display assemblies, and the controller may rotate the first rotating magnet such that the distances from the range sensor to the first and second display assemblies become equal, when the distances from the range sensor to the first and second display assemblies are different.

In accordance with another aspect of the disclosure, a display device includes a first display assembly including a display module having a display panel displaying a screen in a first direction, and a supporter magnetically coupled with the display module and supporting the display module; a second display assembly arranged to be adjacent to the first display assembly in a direction perpendicular to the first direction; and a level adjustment device configured to adjust a level of the first or second display assembly in the first direction such that the first and second display assemblies are aligned at the same level in the first direction, wherein the display module comprises a level adjuster arranged to be separated from or contact the supporter such that such that the first and second display assemblies are aligned at the same level in the first direction, and wherein the level adjuster comprises a rotating magnet engaged with external magnetic force and rotated in a second direction perpendicular to the first direction, and an adjustment member engaged with rotation of the rotating magnet and pushes the supporter to the third direction opposite the first direction such that the display module and the supporter are coupled to each other at a distance in the first direction when the rotating magnet is rotated in one direction.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 16 is a cross-sectional view of display assemblies and a level adjustment device, according to another embodiment of the disclosure.

DETAILED DESCRIPTION OF EXEMPLARY EMBODIMENTS

Figure 1:
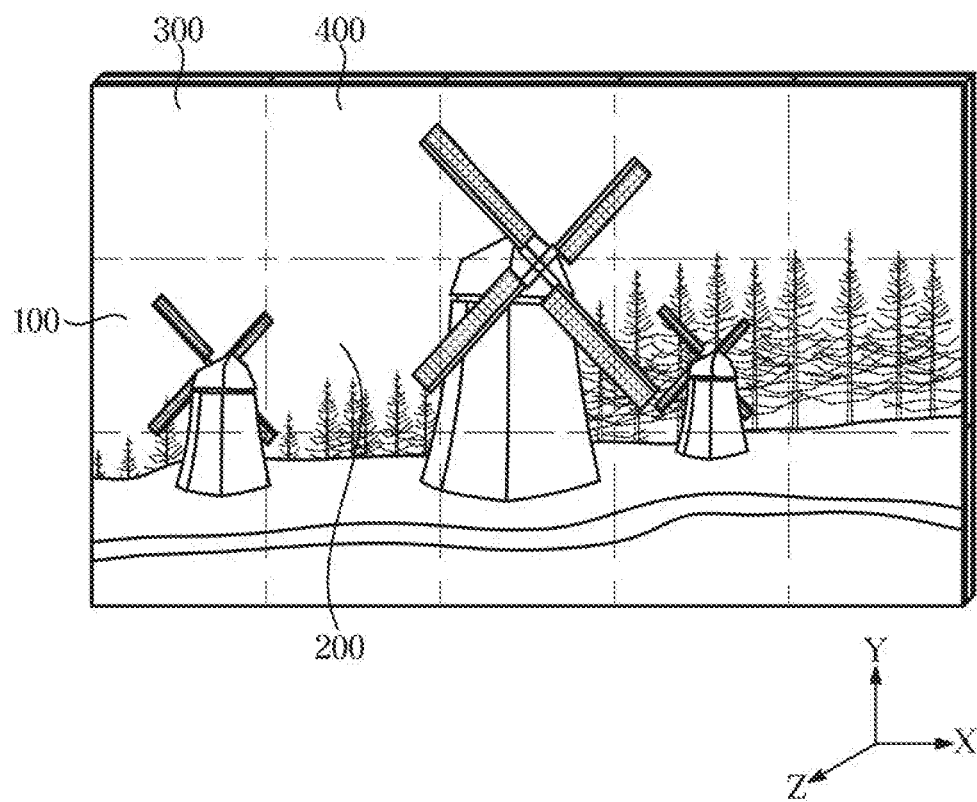
FIG. 1 is a perspective view of a display device, according to an embodiment of the disclosure.

Embodiments and features as described and illustrated in the disclosure are merely examples, and there may be various modifications replacing the embodiments and drawings at the time of tiling this application.

Throughout the drawings, like reference numerals refer to like parts or components.

The terminology used herein is for the purpose of describing particular embodiments only and is not intended to limit the disclosure. It is to be understood that the singular forms "a," "an" and "the" include plural references unless the context clearly dictates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. For example, a first element could be termed a second element without departing from the scope of the disclosure. Descriptions shall be understood as to include any and all combinations of one or more of the associated listed items when the items are described by using the conjunctive term "~and/or~," or the like.

Descriptions shall be understood as to include any and all combinations of one or more of the associated listed items when the items are described by using the conjunctive term "~and/or~," or the like.

Content may be displayed on a display device. The content may be received from a control device connected to the display device and/or another display device connected. The content may also be received from an external server. The content may include a video files or audio file played by an application, e.g., a video player, a music file played by a music player, a photo file presented in a photo gallery, a web page file presented by a web browser, a text file, or the like. The content may also include broadcasting content.

Reference will now be made in detail to embodiments, which are illustrated in the accompanying drawings, wherein like reference numerals refer to the like elements throughout.

Figure 2:
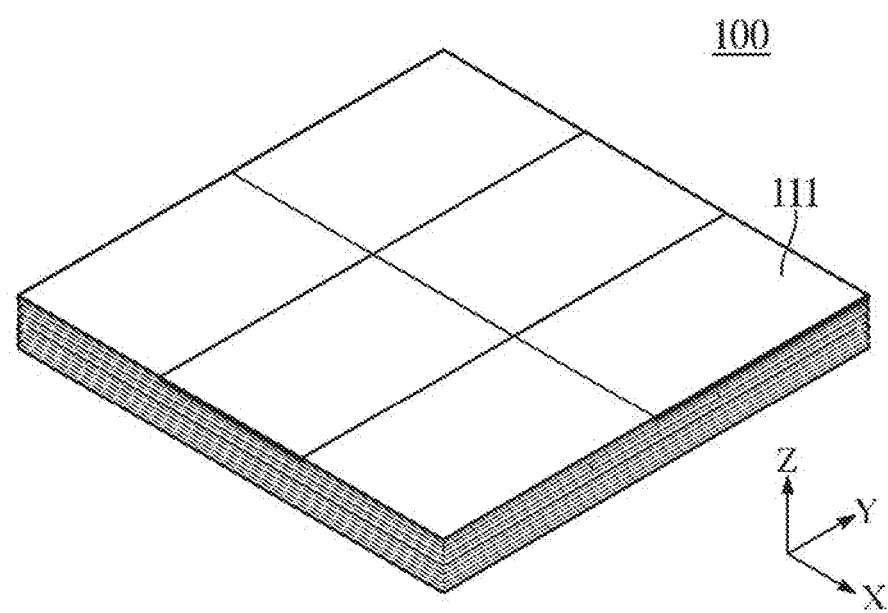
FIG. 2 is a perspective view of a display assembly, according to an embodiment of the disclosure.
Figure 3:
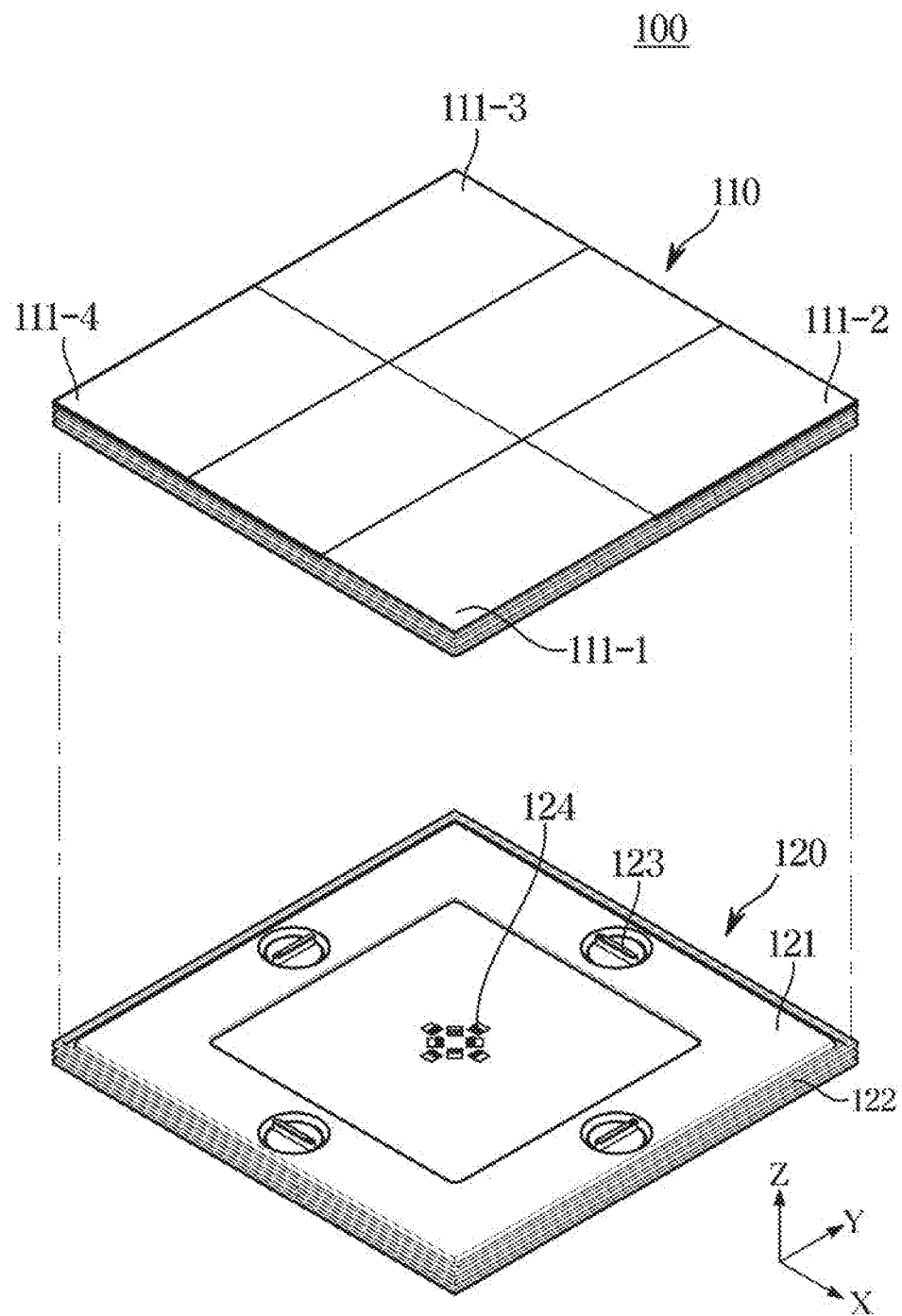
FIG. 3 is an exploded perspective view of a display assembly, according to an embodiment of the disclosure.
Figure 4:
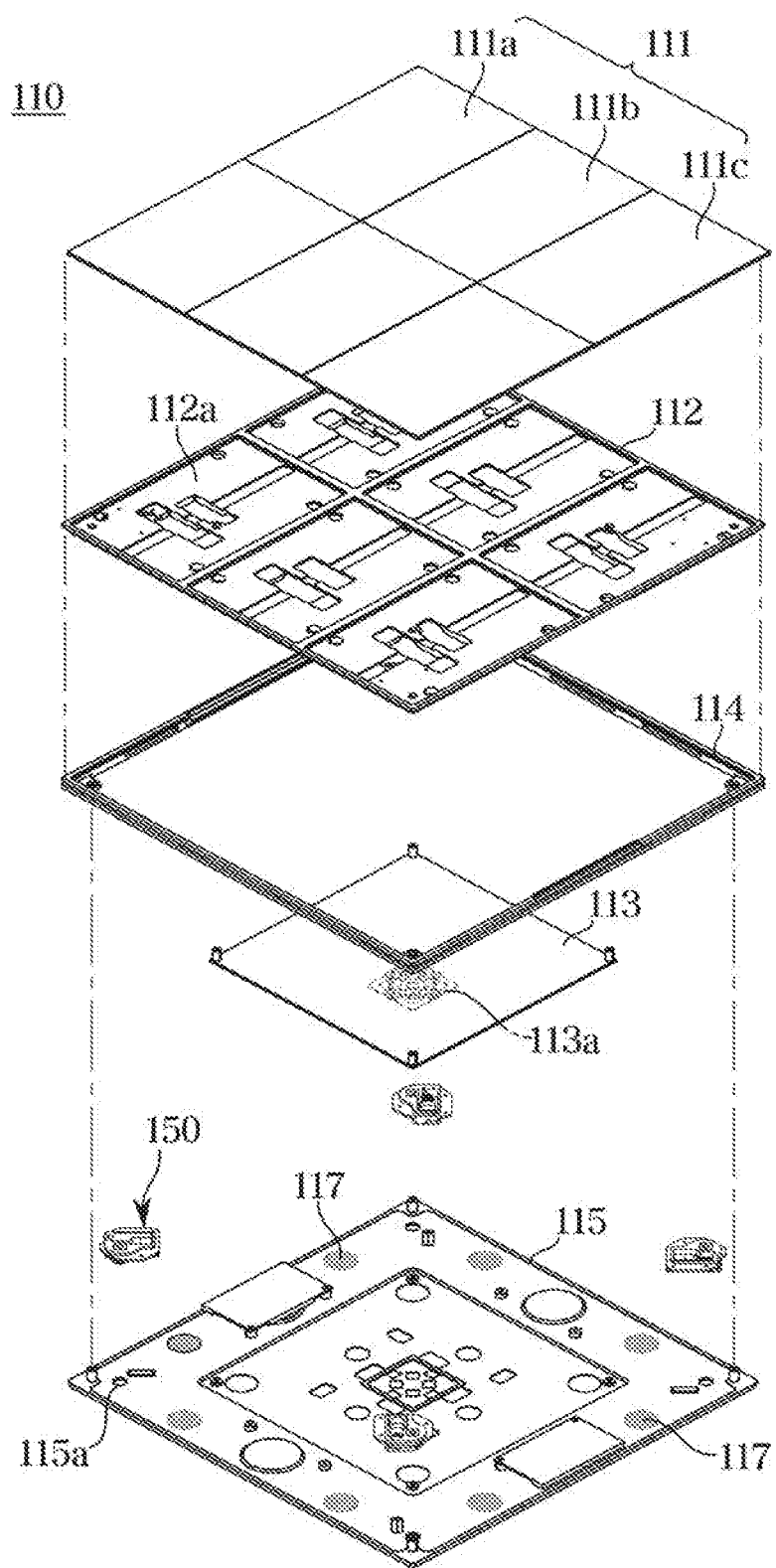
FIG. 4 is an exploded perspective view of a display module of a display assembly, according to an embodiment of the disclosure.

FIG. 1 is a perspective view of a display device, according to an embodiment of the disclosure, FIG. 2 is a perspective view of a display assembly, according to an embodiment of the disclosure, FIG. 3 is an exploded perspective view of a display assembly, according to an embodiment of the disclosure, and FIG. 4 is an exploded perspective view of a display module of a display assembly, according to an embodiment of the disclosure.

Referring to FIG. 1, a display device 10 may include a plurality of display assemblies 100, 200, 300, and 400.

The display device 10 may be provided to have various display forms with the plurality of display assemblies 100, 200, 300, and 400 put together.

For example, depending on coupling positions of the display assemblies 100, 200, 300, and 400, the screen form of the display device 10 may be changed.

The display device 10 may have a single screen by combining the display assemblies 100, 200, 300, and 400. It is not, however, limited thereto, and the display assemblies 100, 200, 300, and 400 may be provided to have screens displaying separate images.

As the display assemblies 100, 200, 300, and 400 have the same form, the display assembly 100 will now be focused as an example to represent the others.

Referring to FIGS. 2 to 4, the display assembly 100 may include a display module 110 having a display panel 111 providing a screen facing forward in a direction Z, and a supporter 120 provided to support the display module 110.

The display module 110 and the supporter 120 may be detachably coupled to each other. For example, the display module 110 and the supporter 120 may be detachably coupled to each other by magnetic force.

The display module 110 may further include a coupling magnet 117 engaged in coupling between the display module 110 and the supporter 120. Furthermore, the supporter 120 may include a metal material to be magnetically coupled with the coupling magnet 117.

The display module 110 and the supporter 120 may be electrically connected to each other. The display module 110 and the supporter 120 electrically connected to each other may exchange power. Specifically, the display module 110 and the supporter 120 may be electrically connected to each other by coupling between a first connector 113a of the display module 110 and a second connector 124 of the supporter 120.

The supporter 120 may include a front surface 121 facing the display module 110 when combined with the display module 110. The front surface 121 of the supporter 120 may be formed with a metal substance.

Hence, when the display module 110 is combined with the supporter 120, the rear surface of a cover frame 115 that constitutes the back of the display module 110 may come into contact and may be magnetically coupled with the front surface 121 of the supporter 120 by the coupling magnet 117 arranged in the display module 110.

Specifically, when the display module 110 and the supporter 120 are combined, the rear surface of the cover frame 115 of the display module 110 may be arranged to face the front surface 121 of the supporter 120 in the front-back direction Z, and attraction force produced by the coupling magnet 117 between the display module 110 and the supporter 120 may enable the rear surface of the cover frame 115 and the front surface 121 of the supporter 120 to be in contact with each other to combine the display module 110 and the supporter 120.

The display assembly 100 may further include coupling units(not shown) provided to combine the display assembly 100 with a plurality of neighboring display assemblies 200 and 300 or combine the display assembly 100 with accessories.

The coupling units may be arranged inside a housing 122 of the supporter 120. The display assembly 100 may further include a manipulation unit 123 coupled with the coupling unit to make the coupling unit work. The manipulation unit 123 may be provided on the front surface 120a of the supporter 120 to be exposed outside the supporter 120. For example, the manipulation unit 123 may have the form of a knob. It is not, however, limited thereto, and may be variously modified.

The coupling unit engaged with the manipulation unit 123 may protrude out of the supporter housing 122 to be combined with the neighboring display assembly 200 or 300 when the manipulation unit 123 is rotated in one direction.

The display module 110 may include at least one light emitting diode (LED) panels 111a, 111b, and 111c to form the display panel 111. There may be various number of LED panels 111a, 111b, and 111c that form the display panel 111.

The LED panels 111a, 111b, and 111c may each have a plurality of LEDs (not shown) mounted thereon. The plurality of LEDs may irradiate light forward in the direction Z.

The plurality of LEDs emitting red, green, and blue light may be arranged in the form of a matrix.

Of the plurality of LEDs, a red LED, a green LED, and a blue LED may be packaged in a pixel, and the pixels may be arranged in the form of a matrix. The red, green, and blue LEDs constituting one pixel may each be called a sub pixel. Alternatively, the pixel may be implemented with an LED that emits white light and a color filter for filtering the white light into various colors.

As for the plurality of LEDs, a pixel is implemented with sub pixels: red, green, and blue LEDs, and such a pixel may be repeatedly arranged on the at least one LED panel 111a, 111b, and 111c.

The display device 10 may use the plurality of LEDs mounted on the at least one LED panel 111a, 111b, and 111c to implement a screen. The plurality of LEDs may be driven to display content.

Especially, the plurality of LEDs may be micro LEDs.

The display module 110 may include a supporting frame 112 provided to support the display panel 111.

The supporting frame 112 may include a first supporting surface 112a on which the display panel 111 is placed, and a second supporting surface 112b (see FIG. 7) on which a main board 113 electrically connected to the display panel 111 and a level adjuster 150, which will be described later, are placed. The first supporting surface 112a and the second supporting surface 112b may be on either side of the supporting frame 112.

Four of the level adjusters 150 may be arranged at corners of the display module 100. This will be described in more detail later.

The main board 113 may be electrically connected to the display panel 110 to control the display panel 110.

The main board 113 may include a first connector 113a. As described above, when the display module 110 and the supporter 120 is combined together, the first connector 113a may be combined with a second connector 124 of the supporter 120.

The display module 110 may include a cover frame 115 forming the rear exterior of the display module 110 and covering the supporting frame 112, and an edge frame 114 forming edges of the display module 110.

The edge frame 114 may be in the shape of a square frame. The edge frame 114 may be serrated with alternate arrangement of projections protruding outward from the display module 110 in the direction of thickness Z of the display module 110 and recessions sunken down into the display module 110, The shape of the edge frame 114 is not limited thereto, and may be variously modified.

The edge frame 114 and the cover frame 115 may be integrated into a single form.

The cover frame 115 may include a connector hole for the first connector 113a to be exposed rearward from the display module 110.

The first connector 113a may be exposed outside the display module 110 through the connector hole, and combined with the second connector 124 placed on the front surface 121 of the supporter 120 when the display module 110 and the supporter 120 are combined.

The coupling magnet 117 may be provided in the plural form. The plurality of coupling magnets 117 may be arranged on a surface of the cover frame 215. The display module 110 may include the plurality of coupling magnets 117 and may be arranged on the inner surface of the cover frame 115. The plurality of coupling magnets 117 may be arranged at regular intervals along the edge of the cover frame 115. It is not, however, limited thereto, and the plurality of coupling magnets 117 may be arranged at the corners of the cover frame 115.

As the coupling magnets 117 are placed on the cover frame 115, they may come close to the front surface 121 of the supporter 120 and strong magnetic force may allow the display module 110 and the supporter 120 to be coupled together.

The cover frame 115 may include a through hole 115a formed for an adjustment member 156 of a level adjuster 150, which will be described later, to pass through the cover frame 115 (see FIG. 10). The adjustment member 156 may protrude out of the cover frame 115 through the through hole 115a. This will be described in more detail later.

A level adjustment device 20 of a display system 1 according to the disclosure will now be described.

Figure 5:
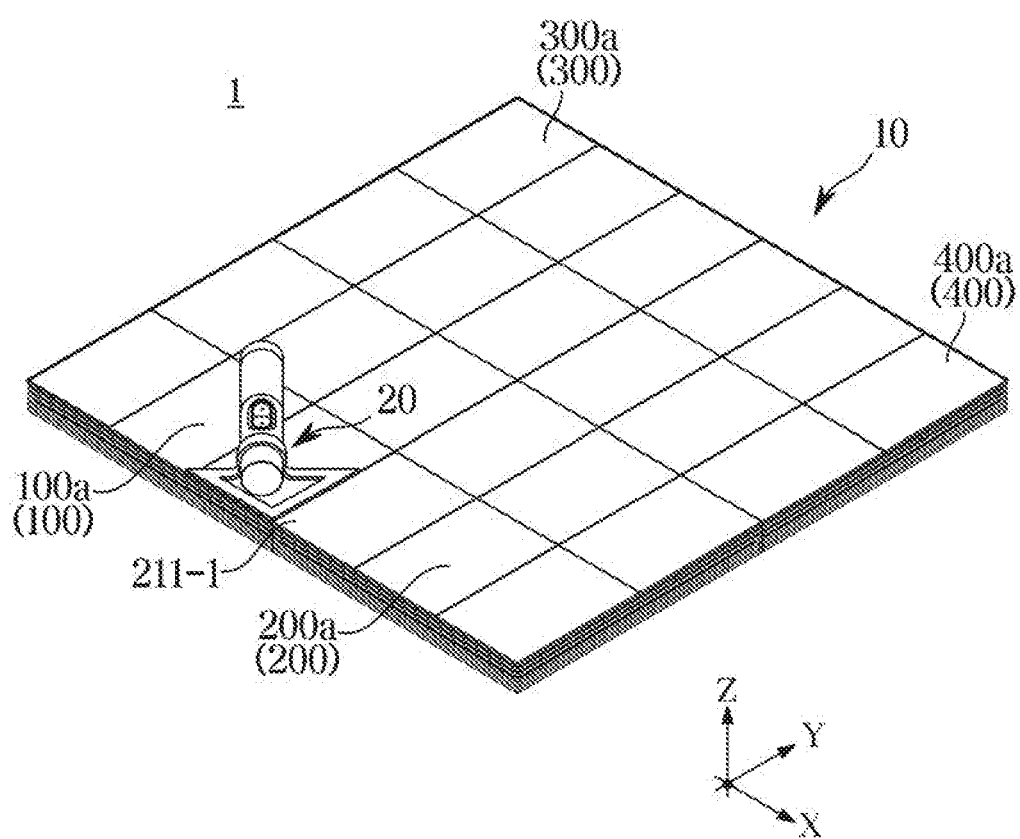
FIG. 5 is a perspective view of a display system, according to an embodiment of the disclosure.
Figure 6:
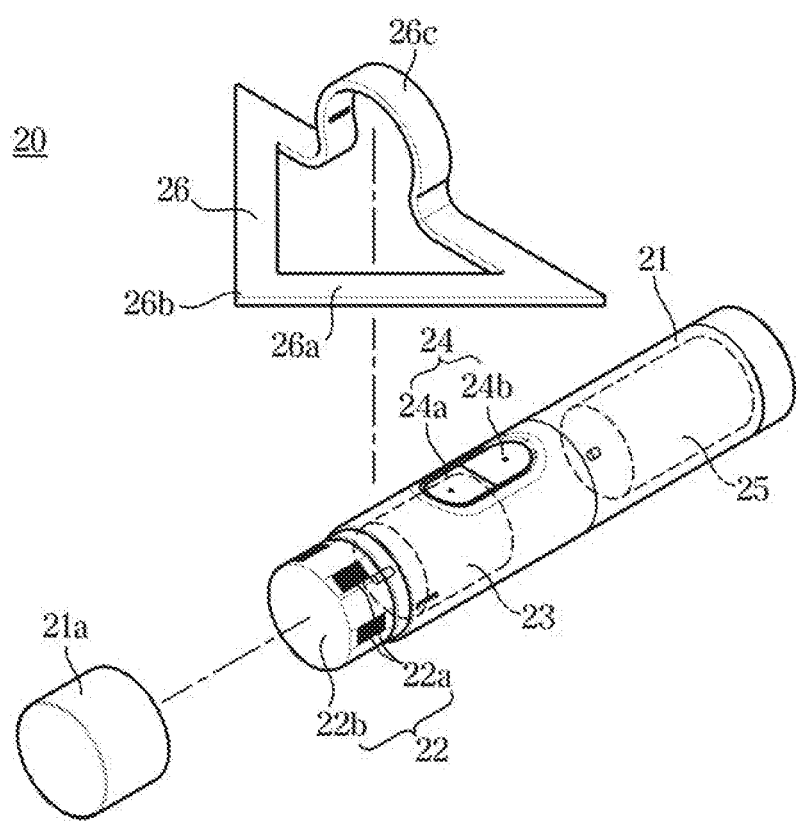
FIG. 6 shows some parts separated from a level adjustment device, according to an embodiment of the disclosure.

FIG. 5 is a perspective view of a display system, according to an embodiment of the disclosure, and FIG. 6 shows some parts separated from a level adjustment device, according to an embodiment of the disclosure.

Referring to FIG. 5, the display system 1 may include the display device 10 and the level adjustment device 20. The display system 1 may be defined in the disclosure to include the display device 10 and the level adjustment device 20 that works with the display device 10 from outside of the display device 10.

The level adjustment device 20 may be placed on the front of the plurality of display assemblies 100, 200, 300, and 400 to adjust the respective front levels of the plurality of display assemblies 100, 200, 300, and 400.

In the following description, a direction toward which the screen of the display device 10 faces is defined as Z, a left-right direction of the display device 10 is X, and a vertical direction of the display device 10 is Y.

The display device 10 may include the first display assembly 100, the second display assembly 200 arranged next to the first display assembly 100 in the direction X, the third display assembly 300 arranged next to the first display assembly 100 in the direction Y, and the fourth display assembly 400 arranged next to the second display assembly in the direction Y and next to the third display assembly 300 in the direction X.

The display assemblies 100, 200, 300, and 400 may be coupled by the respective coupling units.

Respective fronts 100a, 200a, 300a, and 400a of the display assemblies 100, 200, 300, and 400 may not be aligned at the same level in the direction Z due to a problem with installation of the display device 10.

The direction Z will now be referred to as a first direction Z.

For example, when the display assemblies 100, 200, 300, and 400 are installed on e.g., a wall, the respective fronts 100a, 200a, 300a, and 400a of the display assemblies 100, 200, 300, and 400 may not occasionally be aligned at the same level in the first direction Z.

This occasional misalignment of the respective fronts 100a, 200a, 300a, and 400a of the display assemblies 100, 200, 300, and 400 may cause degradation of screen quality of the display device 100.

To prevent this, extra labor is required for fine level alignment of the display assemblies 100, 200, 300, and 400 in the first direction Z such that the respective fronts 100a, 200a, 300a, and 400a of the display assemblies 100, 200, 300, and 400 are aligned at the same level in the first direction Z, after installation of the display device 10 is completed.

For example, when the first display assembly 100 protrudes or retreats from the other display assemblies 200, 300, and 400 in the first direction Z, the first display assembly 100 is required to be pushed back or pulled forward in the first direction Z so that the front 100a of the first display assembly 100 is aligned at the same level with the fronts 200a, 300a, and 400a of the other assemblies 200, 300, and 400 in the first direction Z.

In this case, as the display assembly 100 has the display module 110 and the supporter 120 magnetically coupled to each other as described above, the misalignment problem may be solved by a certain process of adjusting a coupling distance at which the display module 110 and the supporter 120 are coupled. However, the adjustment process is complicated and requires too much time, leading to an additional problem.

In an embodiment of the disclosure, the display system 1 may easily adjust the level in the first direction Z between the fronts 100a, 200a, 300a, and 400a of the display assemblies 100, 200, 300, and 400 through the level adjustment device 20.

The display assemblies 100, 200, 300, and 400 have the same structure as described above, so a level adjustment technique using the level adjustment device 20 will now be focused on the first display assembly 100 (in the following description, the first display assembly 100 will be also called the display assembly 100).

The level adjustment device 20 may be placed on the front 100a of the display assembly 100 as a separate structure.

When the level adjustment device 20 is placed on the display panel 111 in the first direction Z, the level adjustment device 20 transmits magnetic force to the level adjuster 150 arranged inside the display module 110 so that the level adjuster 150 may adjust the level of the display module 100 in the first direction Z.

In other words, the level adjustment device 20 may drive the level adjuster 150 to adjust the level of the display module 100 in the first direction Z.

As described above, the level adjusters 150 may be arranged at the respective corners of the display module 110. Accordingly, the level adjustment device 20 may adjust levels of the four corners of the front 100a of the display assembly 100 in the first direction Z.

Assuming that a bottom left corner, a top right corner, a top left corner, and a bottom left corner are first, second, third, and fourth corners 111-1, 111-2, 111-3, and 111-4, respectively, the four level adjusters 150 may be arranged at locations corresponding to the first to fourth corners 111-1 to 111-4 in the first direction Z (see FIG. 3).

When the level adjustment device 20 is placed on the top of the first corner 111-1 of the front 100a of the display assembly 100 in the first direction Z, it may work with the level adjuster 150 located at the corresponding location to the first corner 111-1 to adjust the level of the first corner 111-1 in the first direction Z.

When the level adjustment device 20 is placed on the top of the second corner 111-2 to the fourth corner 111-4 of the front 100a of the display assembly 100 in the first direction Z, it may work with the respective level adjusters 150 located at the corresponding locations to the second corner 111-2 to the fourth corner 111-4 and adjust the levels of the first corner 111-2 to the fourth corner 111-4 in the first direction Z.

As such, the level adjustment device .0 may work with the respective level adjusters 150 arranged at the corners of the display module 110 and adjust the four corners of the front 100a of the display assembly 100 in the first direction Z.

Accordingly, the level adjustment device 20 may finely adjust the level of the front 100a of the display assembly 100 in the first direction Z.

Referring to FIG. 5, when the level adjustment device 20 is placed on the first corner 111-1 formed on the bottom right of the front 100a. of the display assembly 100, the level of the first corner 111-1 in the first direction Z may be adjusted by the level adjuster 150 arranged on the bottom right corner inside the display module 110 that works with the level adjustment device 20.

In this case, the level adjustment device 20 may drive the level adjuster 150 arranged at the location corresponding to the first corner 111-1 in the first direction Z such that the first corner 111-1 is aligned at the same level in the first direction Z with a corner of the front 200a of the second display assembly 200 adjacent to the first corner 111-1 in the direction X.

As described above, the four level adjusters 150 arranged to correspond to the respective corners in the first direction Z have the same structure, so the level adjuster 150 arranged at a location corresponding to the first corner 111-1 will be focused in the following description o avoid repetitive explanation.

Referring to FIG. 6, the level adjustment device 20 may include a housing 21, and a first rotating magnet 22 arranged inside the housing 21 and rotated by a motor 23.

The first rotating magnet 22 may include a first magnet 22a and a first rotator 22b to which the first magnet 22a is inserted and the motor 23 is connected.

The first magnet 22a may be provided in the plural, in which case the plurality of first magnets 22a may be arranged at certain intervals in the circumferential direction of the first rotator 22b.

The first rotator 22b may have a cylindrical shape, including a space to which the first magnet 22a is inserted. Furthermore, the first rotator 22b may be coupled to the motor 23 and rotated in one direction or the other direction around a rotation axis that corresponds to a rotation axis of the motor 23.

The level adjustment device 20 may include a switch 24 to control driving of the motor 23. The level adjustment device 20 may further include a battery 25 to drive the motor 23.

As described above, the level adjustment device 20 is a separate device from the display device 1, and the user may place the level adjustment device 20 on the front 100a of the display assembly 100 in the first direction Z.

Furthermore, the user may drive the motor 23 through the switch 24 to rotate the first rotating magnet 22.

The switch 24 may be provided to control the motor 23 to be rotated in one direction or the other direction, or to be stopped.

Specifically, the switch 24 may include a first button 24a and a second button 24b.

When no pressure is applied by the user to the first and second buttons 24a and 24b, the motor 23 is not driven. When the user pushes down the first button 24a, the motor 23 may be rotated in one direction. When the user stop pushing down the first button 24a, the rotation of the motor 23 in the one direction is stopped.

When the user pushes down the second button 24b, the motor 23 may be rotated in the other direction. When the user stop pushing down the second button 24b, the rotation of the motor 23 in the other direction is stopped.

As will be described later, as the first rotating magnet 22 is rotated, a second rotating magnet 152 of the level adjuster 150 engaged with the first rotating magnet 22 may be rotated, and accordingly, the adjustment member 156 of the level adjuster 150 may pressurize the front surface 121 of the supporter 120. With the pressure of the adjustment member 156, the display module 110 may move forward or backward against the supporter 120 in the first direction Z, and accordingly, the level of the front 100a of the display assembly 100 may be adjusted in the first direction Z (see FIG. 11).

The level adjustment device 20 may include a stand 26 provided to hold the level adjustment device 20 above the front 110a of the display assembly 100 at a certain height in the first direction Z.

The stand 26 may guide the position of the level adjustment device 20 for the user to place the level adjustment device 20 in a position to work with the level adjuster 150.

As described above, the level adjustment device 20 is placed above the front 100a of the display assembly 100 while the user is holding the level adjustment device 20.

The stand 26 may be provided to hold the level adjustment device 20 above the front 100a of the display assembly 100 to be parallel front 100a of the display assembly 100.

Figure 9:
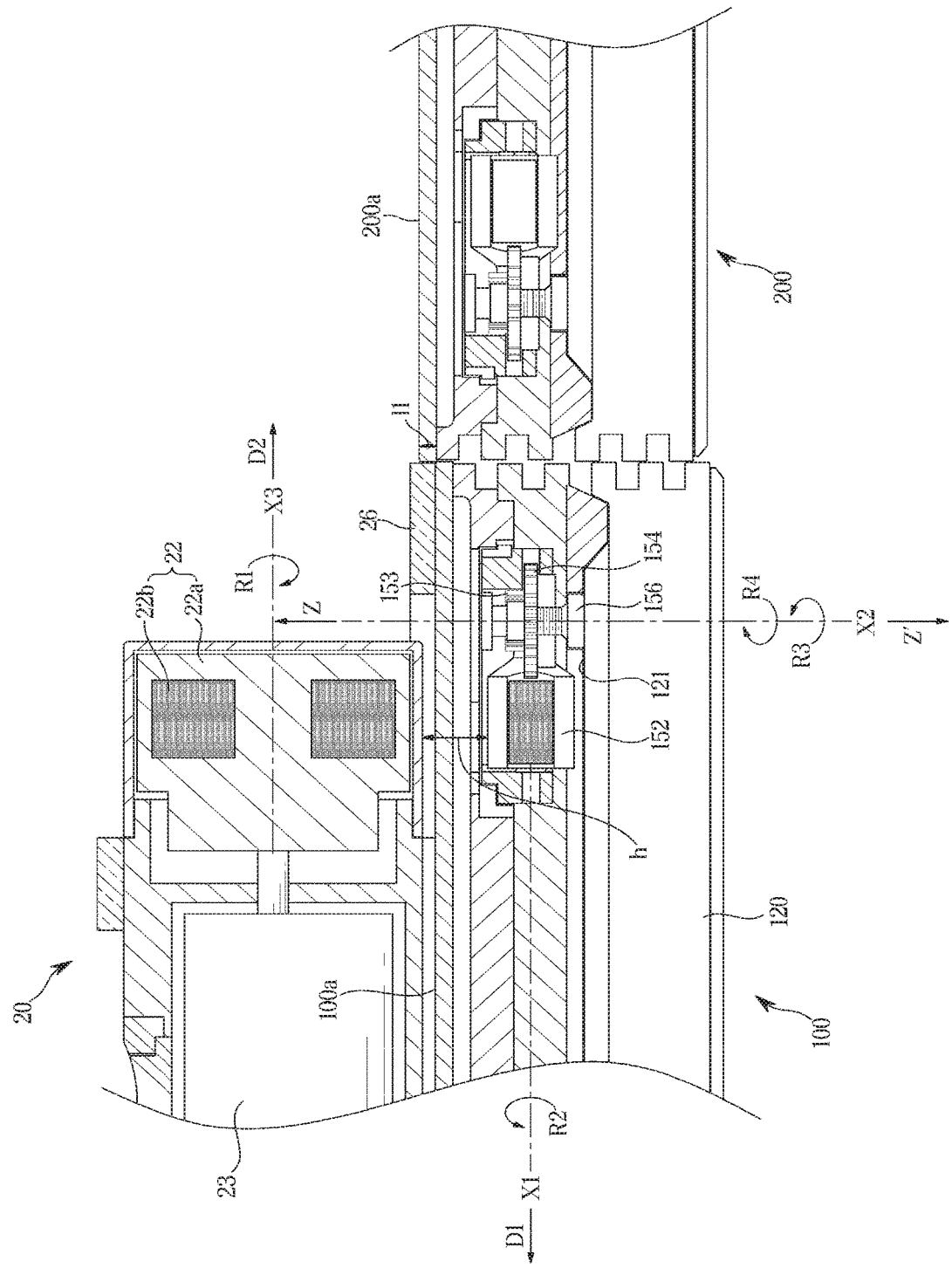
FIG. 9 is a cross-sectional view of a level adjustment device and display assemblies, according to an embodiment of the disclosure.

When the bottom of the stand 26 is placed to contact the front 100a of the display assembly 100, the stand 26 may guide the position of the level adjustment device 2 such that a rotation axis X3 of the first rotating magnet 22 of the level adjustment device 20 is nearly parallel to the rotation axis X1 of the second rotating magnet 152 of the level adjuster 150 (see FIG. 9).

The stand 26 may include a triangular supporting section 26a forming a right angle, and a coupling section 26c to be coupled with the level adjustment device 20.

The section forming the right angle (called the right angle section 26b) in the supporting section 26a may be placed on the first corner 111-1 in order to guide the level adjustment device 20 to be placed at a location corresponding to the level adjuster 150 in the X and Y plane.

Specifically, when the right angle section 26b of the supporting section 26a is placed to correspond to the first corner 111-1 in the first direction Z, the stand 26 may guide the position of the level adjustment device 20 such that the first rotating magnet 22 and the second rotating magnet 152 of the level adjuster 150 are placed in corresponding positions in the first direction Z.

The stand 26 enables the level adjustment device 20 to be placed at a location to work with the level adjuster 150, and the level adjustment device 20 may then control the level adjuster 150 by rotation of the first rotating magnet 22.

The level adjuster 150 of the display module 110 to work with the level adjustment device 20 will now be described.

Figure 7:
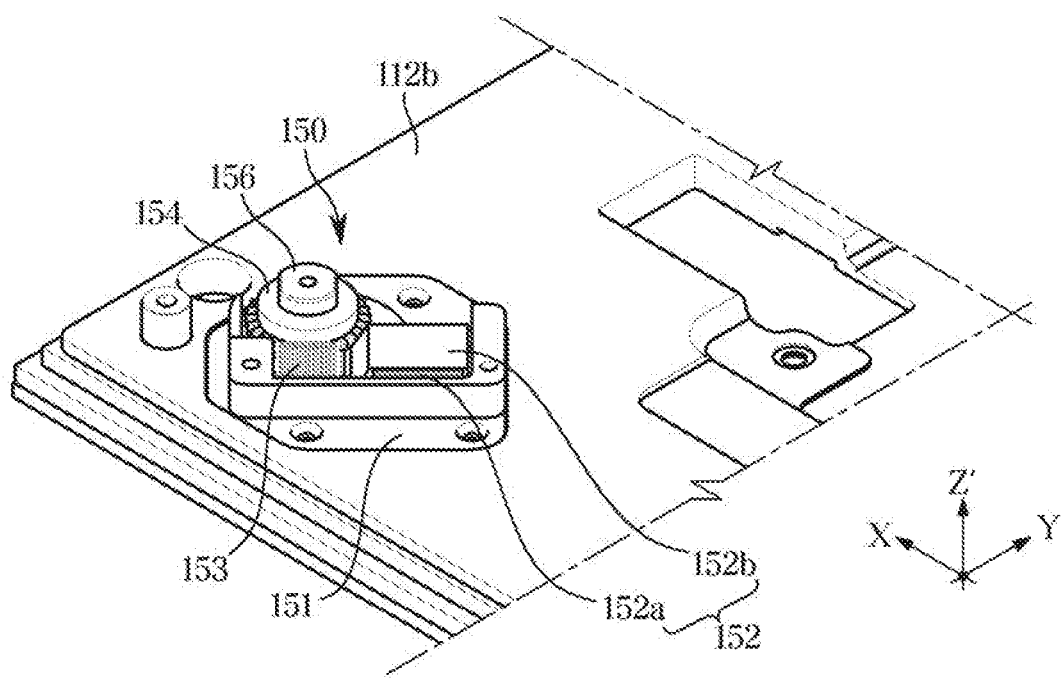
FIG. 7 is a bottom perspective view of a level adjuster of a display module, according to an embodiment of the disclosure.
Figure 8:
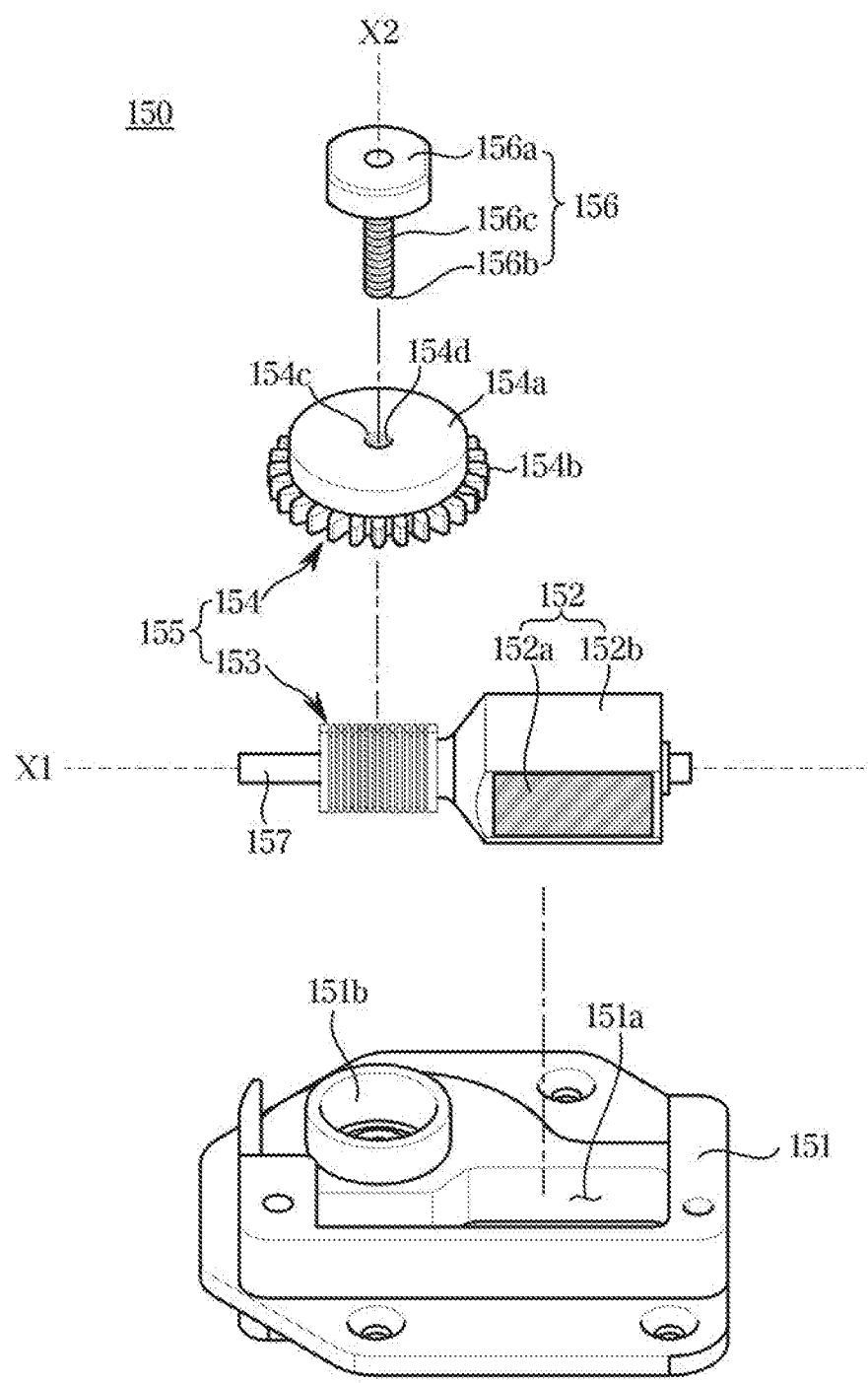
FIG. 8 is an exploded perspective view of a level adjuster of a display module, according to an embodiment of the disclosure.

FIG. 7 is a bottom perspective view of a level adjuster of a display module, according to an embodiment of the disclosure, FIG. 8 is an exploded perspective view of a level adjuster of a display module, according to an embodiment of the disclosure, and FIG. 9 is a cross-sectional view of a level adjustment device and display assemblies, according to an embodiment of the disclosure.

Referring to FIGS. 7 and 8, the level adjuster 150 may be arranged on the second supporting surface 112b of the supporting frame 112.

Specifically, the level adjuster 150 may include a bracket 151 attached onto the second supporting surface 112, and the second rotating magnet 152 arranged inside the bracket 151 to work with the first rotating magnet 22.

The second rotating magnet 152 may include a second magnet 152a and a second rotator 152b rotated with the second magnet 152a.

When the first rotating magnet 22 is rotated above the display module 110 in one direction or the other direction toward the first direction Z, the second rotating magnet 152 may be engaged with the first rotating magnet 22 and rotated in the other direction or the one direction.

The second rotating magnet 152 may be engaged with the first rotation magnet 22 and rotated in one direction or the other direction around the first rotation axis X1 extending in a second direction D2.

The second direction D2 may be defined to be perpendicular to the first direction Z.

The level adjuster 150 may include the adjustment member 156 that makes translational motion in the first direction Z and the opposite direction, called a third direction Z'.

The level adjuster 150 may include a worm gear 155 for conveying the rotational force of the second rotating magnet 152 to the adjustment member 156.

The worm gear 155 may include a worm 153 extending from the second rotating magnet 152 and a worm wheel 154 interlocked with the worm 153.

The worm 153 may extend from an end of the second rotator 152b. Specifically, a rotation shaft of the worm 153 may extend from an end of the second rotating magnet 152 along the first rotating axis X1 so that the rotation shaft of the worm 153 corresponds to the first rotation axis X1.

The worm 153 may be rotated around the first rotation axis X1 in one direction or the other direction like the second rotating magnet 152.

The worm wheel 154 interlocked with the worm 153 may be engaged with rotation of the worm 153 and rotated in one direction or the other direction around the second rotation axis X2 extending along the first direction Z.

The worm gear 155 may change the rotational direction around a rotation axis in the second direction D1 to a rotational direction around a rotation axis in the first direction Z.

The worm wheel 154 may include a center portion 154a arranged around the second rotation axis X2, and a gear part 154b extending from the center portion 154a in the radial direction and forming a gear interlocked with the worm 153.

The center portion 154a may have an insertion hole 154c formed along the second rotation axis X2 for the adjustment member 156 to be rotationally inserted thereto.

The adjustment member 156 may be rotationally inserted to the insertion hole 154c. The adjustment member 156 may make translational motion in the first direction Z and the third direction Z' by being rotated inside the insertion hole 154c.

The adjustment member 156 may include a pressurizer 156a provided to push down the supporter 120 in the third direction Z' and a body 156b to be inserted to the insertion hole 154c.

The inner circumferential surface of the insertion hole 154c may be formed with first threads 154d. The outer circumferential surface of the body 156b may be formed with second threads 156c corresponding to the first threads 154d.

When the worm wheel 154 is rotated in one direction or the other direction around the second rotation axis X2, the first threads 154d may be rotated in the one direction or the other direction like the worm wheel 154.

In this case, the adjustment member 156 inserted to the insertion hole 154c may be rotated in the opposite direction of the rotation direction of the worm wheel 154 by the second threads 156c interlocked and rotated with the first threads 154d when the first threads 154d is rotated.

As the adjustment member 156 is rotated inside the insertion hole 154c formed along the second rotation axis X2, the adjustment member 156 may be rotated in one direction or the other direction around the second rotation axis X2.

When the adjustment member 156 is rotated, the adjustment member 156 is guided by the first threads 154d to make minute movement in the first direction Z or the third direction Z'.

The level adjuster 150 may include a shaft 157 extending in the rotation axis X1 of the second rotating magnet 152 and the worm 153.

The shaft 157 may be rotationally coupled with the bracket 151 inside the bracket 151 so that the extension of the shaft 157 is directed to the second direction D1.

The bracket 151 may include a first receiver 151a in which the second rotating magnet 152 and the worm 153 are received. As the first receiver 151a receives the second rotating magnet 152, and the shaft 157 is fixed inside the bracket 151, the second rotating magnet 152 and the worm 153 may be prevented from falling out of the bracket 151 while being rotated.

Furthermore, the bracket 151 may include a second receiver 151b in which the worm wheel 154 is received.

The worm wheel 154 may be rotated around the second rotation axis X2 in one direction or the other direction while received in the second receiver 151b.

As the worm wheel 154 is received in the second receiver 151b, the worm wheel 154 may be rotated around the second rotation axis X2 in one direction or the other direction without moving in the first direction Z or the third direction Z'.

Accordingly, the adjustment member 156 engaged and rotated with the worm wheel 154 may make stable translational motion in the first direction Z or the third direction Z'.

How the level adjustment device 20 and the level adjuster 150 work will now be described in detail.

Figure 10:
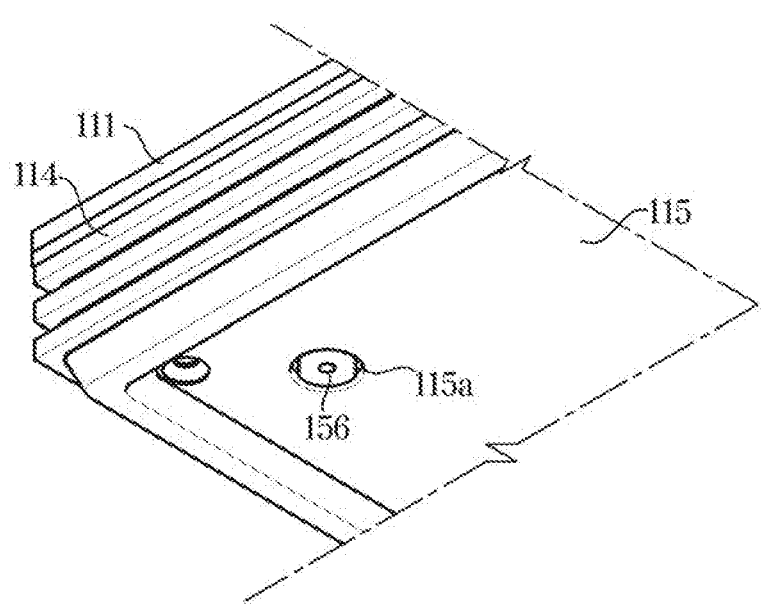
FIG. 10 is a bottom perspective view of a display module, according to an embodiment of the disclosure.
Figure 11:
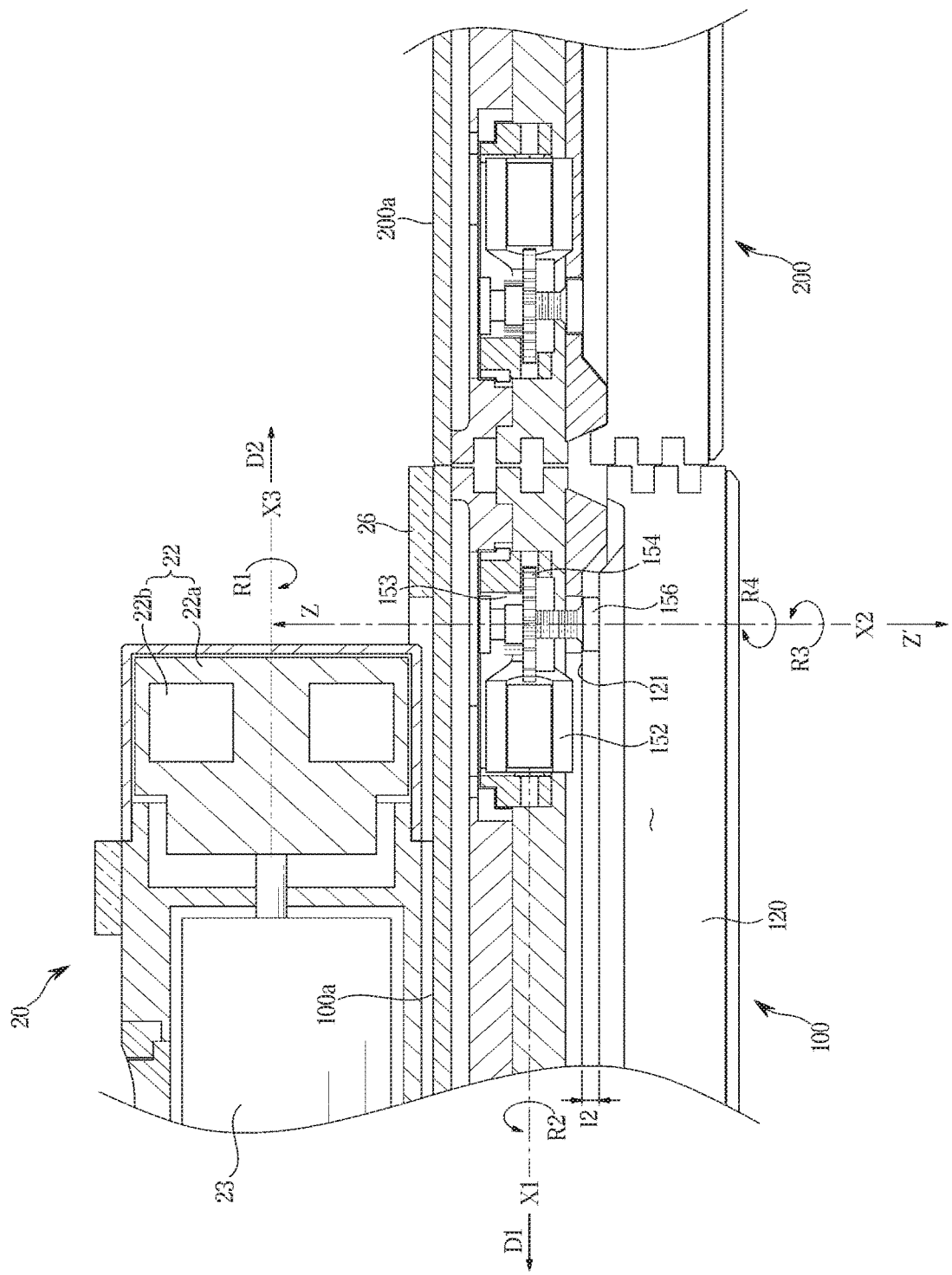
FIG. 11 is a cross-sectional view of a level adjustment device and display assemblies, according to another embodiment of the disclosure.
Figure 12:
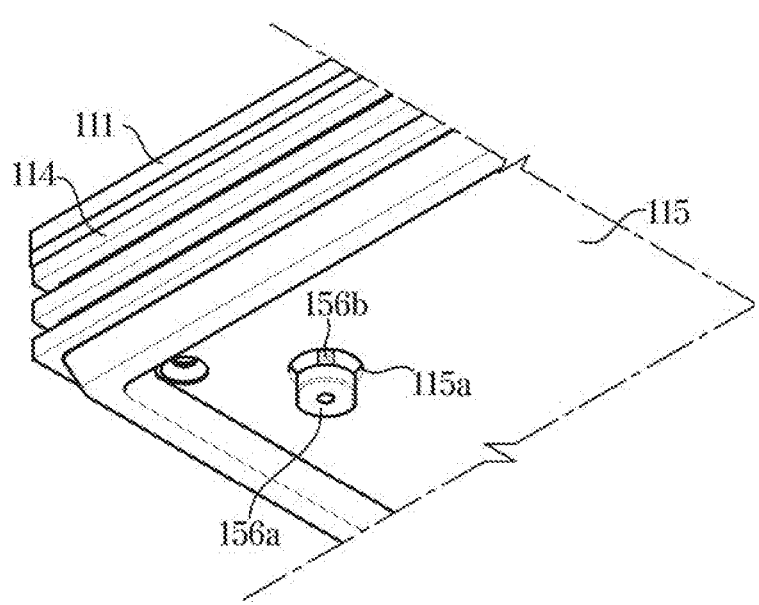
FIG. 12 is a bottom perspective view of a display module, according to another embodiment of the disclosure.

FIG. 9 is a cross-sectional view of a level adjustment device and display assemblies, according to an embodiment of the disclosure, FIG. 10 is a bottom perspective view of a display module, according to an embodiment of the disclosure, FIG. 11 is a cross-sectional view of a level adjustment device and display assemblies, according to another embodiment of the disclosure, and FIG. 12 is a bottom perspective view of a display module, according to another embodiment of the disclosure.

Referring to FIG. 9, for example, a technical method of adjusting the level of the front 100a of the first display assembly 100 will now be described on the assumption that the first corner 111-1 of the front 100a of the first display assembly 100 is located lower in the first direction Z than a neighboring first corner 211-1 of the front 200a of the second display assembly 200 by distance l1.

When there is a need to adjust the level of the first corner 111-1 of the first display assembly 100 in the first direction Z, the user may place the level adjustment device 20 on the top of the first corner 111-1.

The level adjustment device 20 may be placed by the stand 26 to be nearly parallel to the front 100a of the first display assembly 100.

Specifically, the stand 26 may guide the level adjustment device 20 to be placed on the front 100a of the first display assembly 100 such that the direction D2 to which the third rotation axis X3 extends is substantially parallel to the front 100a of the first display assembly 100.

When the level adjustment device 20 is placed on the first corner 111-1 of the first display assembly 100, the user may drive the motor 23 to be rotated in one direction through the switch 24.

The first rotating magnet 22 engaged with rotation of the motor 23 may then be rotated in a first rotation direction R1 around the third rotation axis X3.

The rotation of the first rotating magnet 22 may transmit magnetic force of the first rotating magnet 22 to the second rotating magnet along the first rotation direction R1.

The second rotating magnet 152 engaged with the first rotating magnet 22 may then be rotated in the second rotation direction R2 around the first rotation axis X1.

Accordingly, the worm 153 coupled with the second rotating magnet 152 may be rotated along with the second rotating magnet 152 in the second rotation direction R2 around the first rotation axis X1.

The worm wheel 154 interlocked with the worm 153 may be engaged with rotation of the worm 153 in the second rotation direction R2 and rotated in the third rotation direction R3 around the second rotation axis X2.

At this time, a direction of the rotational force transmitted by the worm 153 and the worm wheel 154 from the motor 23 may be changed into a perpendicular direction.

With the rotation of the worm wheel 154 in a third rotation direction R3, the adjustment member 156 inserted to the worm wheel 154 may be rotated in a fourth rotation direction R4 opposite the third rotation direction R3 around the second rotation axis X2.

While the adjustment member 156 is rotated in the fourth rotation direction R4, the adjustment member 156 may be guided by the first threads 154d of the worm wheel 154 and moved in the third direction Z'.

Referring to FIG. 10, when the display module 110 and the supporter 120 are combined, the adjustment member 156 may be arranged inside the cover frame 115.

With the above mechanism, however, the adjustment member 156 may be engaged with rotation of the first rotating magnet 22 of the level adjustment device 20 and moved in the third direction Z', as shown in FIG. 11.

The adjustment member 156 may be moved a certain distance by the worm gear 155 and the first threads 156d in the third direction Z'. An inclination angle between the worm 153 and the first threads 156d may be set for the certain distance to be a minute distance.

Through continuous rotation of the first rotating magnet 22, the adjustment member 156 may be gradually moved in the third direction Z'.

For example, as shown in FIG. 12, the adjustment member 156 may protrude out of the cover frame 115 through the through hole 115a and move toward the supporter 120.

As the adjustment member 156 is moved in the third direction Z', the pressurizer 156a of the adjustment member 156 may push the supporter 120 in the third direction Z', and accordingly, the display module 110 and the supporter 120 may be coupled at a distance l2 that the adjustment member 156 is moved in the third direction Z'.

In this case, as the adjustment member 156 protrudes in the third direction Z', the adjustment member 156 may push the supporter 120 in the third direction Z' by the length l2 that the adjustment member 156 is moved in the third direction Z'. Accordingly, a gap as long as the length l2 that the adjustment member 156 is moved in the third direction Z' may be formed between the rear surface of the cover frame 115 of the display module 110 and the front surface 121 of the supporter 120.

As described above, the display module 110 and the supporter 120 are magnetically coupled to keep producing the magnetic force such that the display module 110 is directed toward the third direction Z' and the supporter 120 is directed to the first direction Z.

Hence, even though there is the gap as long as the length l2 that the adjustment member 156 is moved in the third direction Z' formed between the rear surface of the cover frame 115 of the display module 110 and the front surface 121 of the supporter 120, magnetic coupling between the display module 110 and the supporter 120 may be maintained.

At this time, the first connector 113a and the second connector 124 connected to each other between the display module 110 and the supporter 120 may remain connected even when there is a certain gap formed between the cover frame 115 and the front surface 121 of the supporter 120.

Accordingly, even when there is the certain gap formed between the cover frame 115 and the front surface 121 of the supporter 120 due to the pressure of the adjustment member 156, the supporter 120 and the display module 110 may be electrically connected to each other.

When the adjustment member 156 is moved in the third direction Z' to make a gap as long as the certain distance l2 between the display module 110 and the supporter 120, the display module 110 may be moved as far as the certain distance l2 in the first direction Z.

When the first rotating magnet 22 is rotated until the certain distance l2 becomes equal to the difference in height l1 between the front 100*a* of the first display assembly 100 and the front 200*a* of the second display assembly 200, the front 100*a* of the first display assembly 100 may be aligned at the same level with the front 200*a* of the second display assembly 200 in the first direction Z.

When the distance l2 that the adjustment member 156 is moved in the third direction Z' becomes equal to the difference in height l1 between the front 100*a* of the first display assembly 100 and the front 200*a* of the second display assembly 200, the user may limit rotation of the first rotating magnet 22 by stopping driving the motor 23 through the switch 24.

However, when the distance l2 that the adjustment member 156 is moved in the third direction Z' rather exceeds the difference in height l1 between the front 100*a* of the first display assembly 100 and the front 200*a* of the second display assembly 200 because of continuous rotation of the first rotating magnet 22, the user may drive the motor 23 to rotate the first rotating magnet 22 in the opposite direction of the first rotation direction R1.

When the first rotating magnet 22 is rotated in the opposite direction, all the aforementioned parts are rotated reversely and accordingly, the adjustment member 156 may be moved to the opposite direction, i.e., the first direction Z, of the third direction Z'.

Accordingly, the distance l2 that the adjustment member 156 is moved in the third direction Z' may be gradually reduced until it becomes equal to the difference in height l1 between the front 100*a* of the first display assembly 100 and the front 200*a* of the second display assembly 200.

The user may easily adjust the level of the front 100*a* of the first display assembly 100 in the first direction Z by rotating the motor 23 in one direction or the other direction.

On the contrary, When the front 100*a* of the first display assembly 100 is located higher than the front 200*a* of the second display assembly 200, the user may put the level adjustment device 20 on the front 200*a* of the second assembly 200 and drive the second level adjuster 150 of the second assembly 200 to adjust the height of the front 200*a* of the second assembly 200.

As described above, as the display module 110 is moved in the first direction Z while coupled with the supporter 120, the height or level of the display module 110 may be adjusted while the display panel 111 is activated.

Accordingly, the user may accurately adjust the level of the display module 110 by comparing the screen displayed on the display module 110 with the screen displayed on the second display assembly 200.

Furthermore, as described above, the level adjustment device 20 may drive the level adjuster 150 by magnetic force of the first rotating magnet 22, and accordingly, the level adjuster 150 arranged behind the display panel 111 may be controlled in front of the display panel 111 in the first direction Z.

Specifically, even with a certain gap h formed between the first rotating magnet 22 and the second rotating magnet 152, the magnetic force of the first rotating magnet 22 is strong enough to be transmitted to the second rotating magnet 152, so the level adjustment device 20 may easily drive the level adjuster 150 even when the display panel 111 is arranged between the level adjustment device 20 and the level adjuster 150 in the first direction Z.

Accordingly, without disassembling of the display module 110 itself or without decoupling of the display module 110 and the supporter 120, the height of the front 100*a* of the first display assembly 100 may be easily adjusted by the level adjustment device 20 and the level adjuster 150.

That is, even when the display module 110 is in an activated state, the height of the front 100*a* of the first display assembly 100 may be easily adjusted.

A display system 1 including the display device 10 according to another embodiment of the disclosure will now be described. Other parts than a display module 100' are the same as those in the display system 1 according to the previous embodiment of the disclosure, so the description thereof will not be repeated in the following description.

Figure 13:
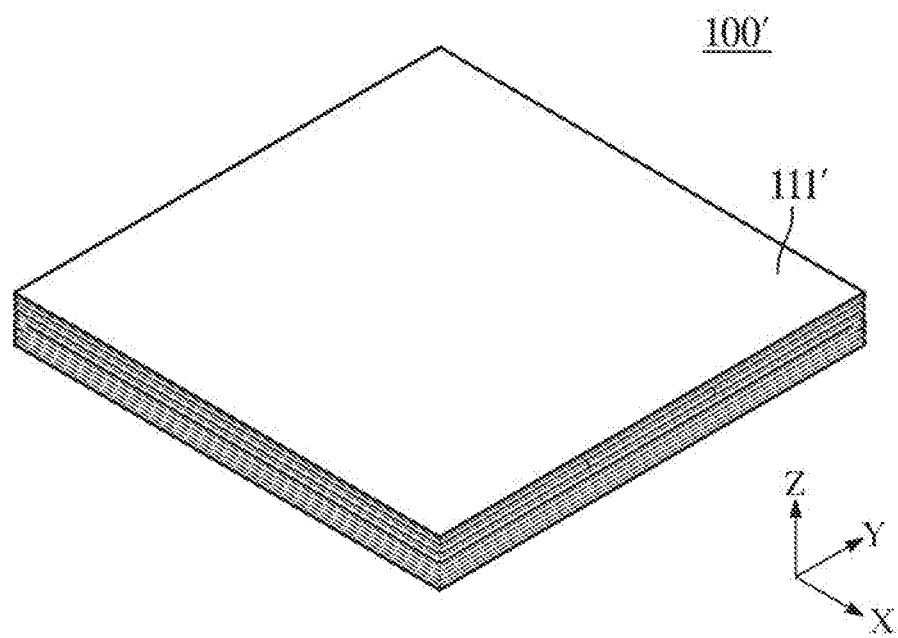
FIG. 13 is a perspective view of a display assembly, according to another embodiment of the disclosure.
Figure 14:
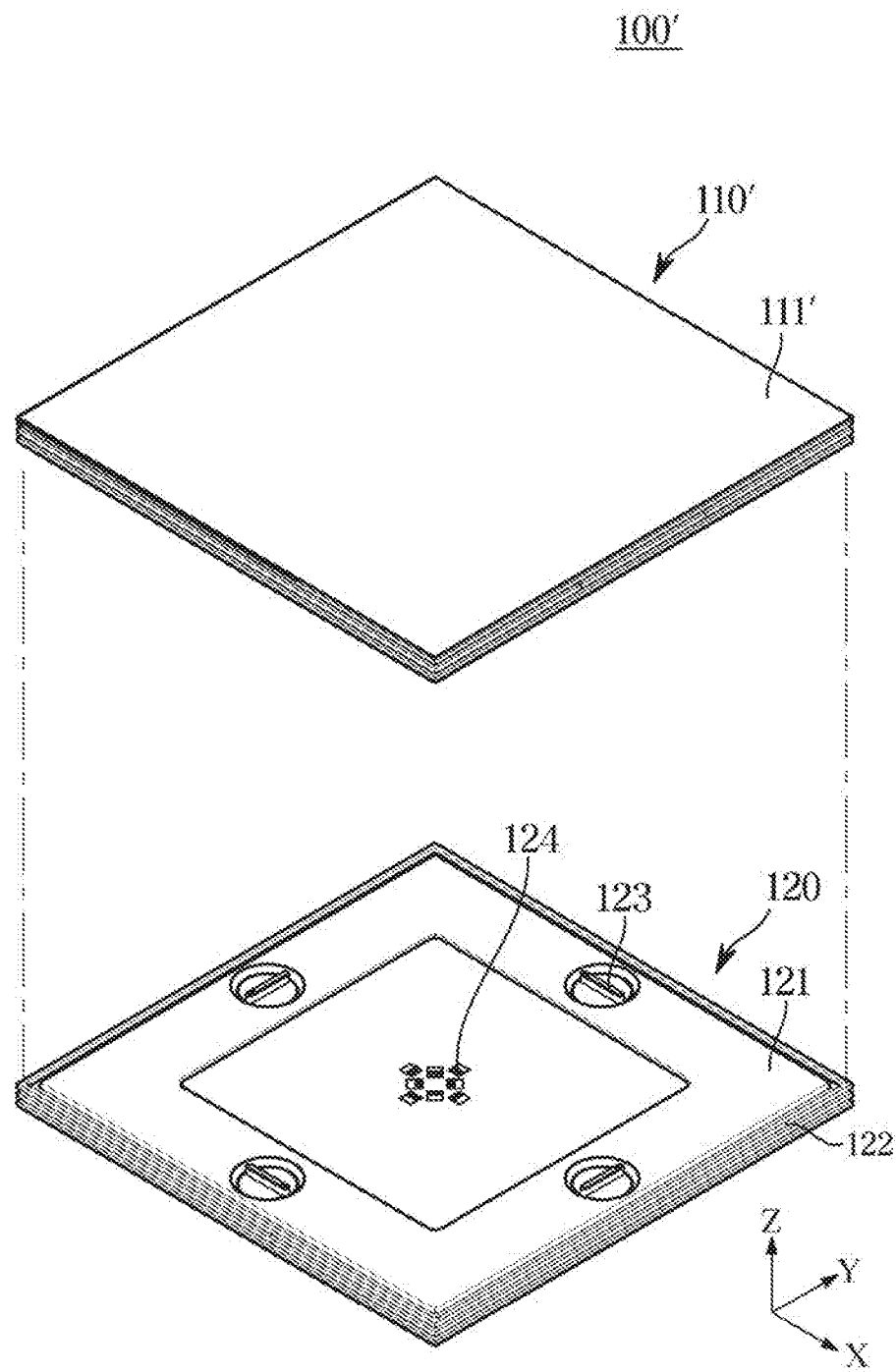
FIG. 14 is an exploded perspective view of a display assembly, according to another embodiment of the disclosure.

FIG. 13 is a perspective view of a display assembly, according to another embodiment of the disclosure, and FIG. 14 is an exploded perspective view of a display assembly, according to another embodiment of the disclosure.

As shown in FIGS. 13 and 14, the display assembly 100' may include a display module 110' having a self-emissive display panel 111'.

The display panel 111' may be provided as a Cathode Ray Tube (CRT) panel, an Electro Luminescence (EL) panel, an Organic Light Emitting Diode (OLED) panel, a Vacuum Fluorescence Display (VFD) panel, a Field Emission Display (FED) panel, Plasma Display Panel (PDP), or the like.

Especially, the display panel 111' may be provided as an Organic LED (OLED) panel displaying a screen with OLEDs.

The display module 110' and the supporter 120 may be detachably coupled to each other. For example, the display module 110' and the supporter 120 may be detachably coupled to each other by magnetic force.

While coupled to the supporter 120, the display module 110' may be electrically connected to the supporter 120 to drive the display panel 111'.

A display system 1' including a level adjustment device 30 according to another embodiment of the disclosure will now be described. Other parts than the level adjustment device 30 are the same as those in the display system 1 according to the previous embodiment of the disclosure, so the description thereof will not be repeated in the following description.

Figure 15:
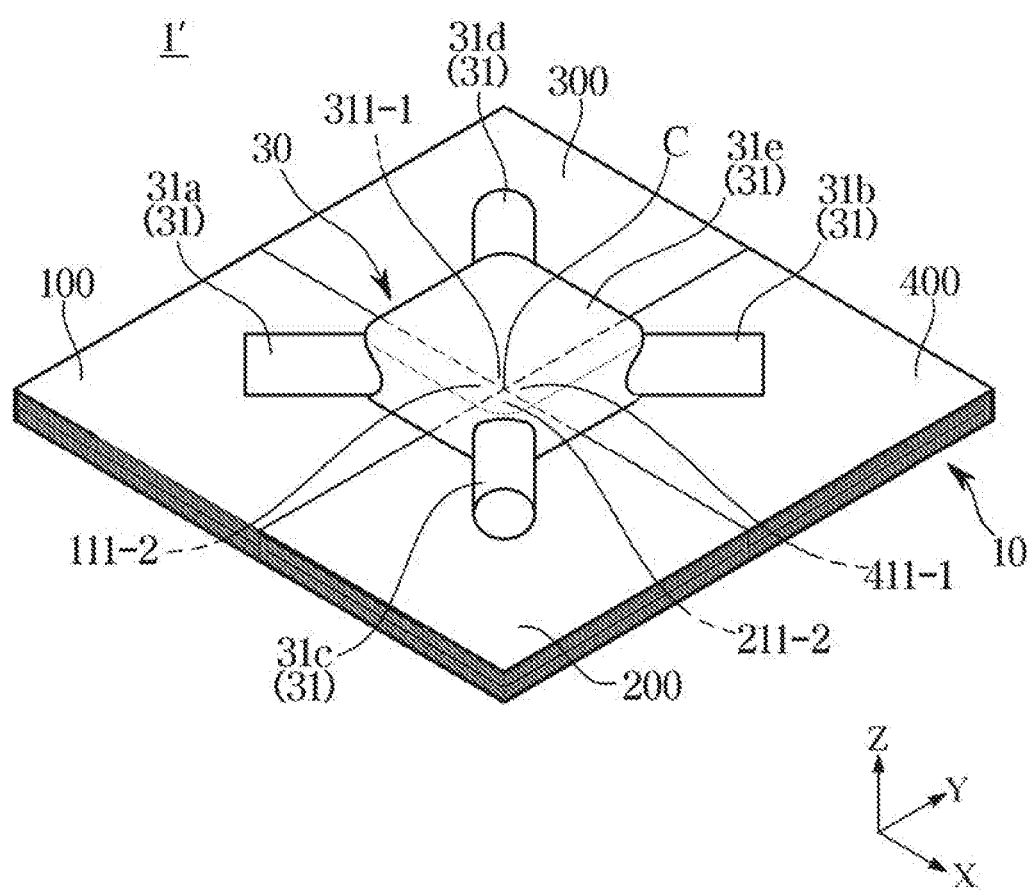
FIG. 15 is a perspective view of a display system, according to another embodiment of the disclosure.

FIG. 15 is a perspective view of a display system, according to another embodiment of the disclosure, and FIG. 16 is a cross-sectional view of display assemblies and a level adjustment device, according to another embodiment of the disclosure.

The level adjustment device 30 may be placed on the front of the plurality of display assemblies 100, 200, 300, and 400 to simultaneously adjust the level or height in the direction Z of the plurality of display assemblies 100, 200, 300, and 400.

Specifically, the level adjustment device 30 may be placed on a center C, where the plurality of display assemblies 100, 200, 300, and 400 join, to simultaneously adjust the height in the first direction Z of the corners of the fronts 100*a*, 200*a*, 300*a*, and 400*a* of the plurality of display assemblies 100, 200, 300, and 400 adjacent to the center C.

From the perspective of the first display assembly 100, the level adjustment device 30 may adjust the level of the front 100a of the first display assembly 100 and the level of the front 100a, 200a, 300a, or 400a of at least one of the neighboring display assemblies 200, 300, or 400.

Furthermore, unlike the level adjustment device 20 as described above in the previous embodiment, the level adjustment device 30 may exempt from the user having to manipulate the switch 24 but may automatically adjust the height in the first direction Z of the corners of the respective fronts 100a, 200a, 300a, and 400a of the plurality of display assemblies 100, 200, 300, and 400 when the user just places the level adjustment device 30 on the fronts 100a, 200a, 300a, and 400a of the plurality of display assemblies 100, 200, 300, and 400.

A technical method of adjusting a second corner 211-2 of the front 200a of the second display assembly 200, a first corner 311-1 of the front 300a of the third display assembly 300, and a first corner 411-1 of the front 400a of the fourth display assembly 400 arranged adjacent to the second corner 111-2 of the front 100a of the first display assembly will now be described as an example.

It is assumed that the corners 111-2, 211-2, 311-4, and 411-1 join at the center C.

Alternatively, in another example, the level adjustment device 30 may adjust the level of the fronts of merely two or three display assemblies depending on where the display assemblies 100, 200, 300, and 400 are located.

Referring to FIG. 15, the level adjustment device 30 may be placed on the center C of the plurality of display assemblies 100, 200, 300, and 400.

The user may put the level adjustment device 30 such that the center of a housing 31 of the level adjustment device 30 is nearly on the top of the center C of the plurality of display assemblies 100, 200, 300, and 400 in the first direction Z.

The housing 31 of the level adjustment device 30 may form the external appearance.

The housing 31 may include a center portion 31e in which a controller 36, various electrical parts and four rotating magnets, which will be described later, are located, and four extensions 31a, 31b, 31c, and 31d extending outward from the corners of the center portion 31e.

The four extensions 31a, 31b, 31c, and 31d may have four motors to drive the four rotating magnets arranged therein, respectively.

The shape of the housing 31 may not be limited thereto, and the housing 31 may have any of various shapes. For example, the housing 31 may have the form of a cube or cylinder without the housing center or extensions.

FIG. 16 is a cross-sectional view of the display system 1'. Specifically, FIG. 16 shows a cross-section resulting from diagonally cutting the X-Y plane of the display system 1' across the first and fourth display assemblies 100 and 400.

As described above, the level adjustment device 30 may include four rotating magnets, four motors for driving the four rotating magnets, and the controller 36 for automatically driving the four motors, and simultaneously adjust the levels in the first direction Z of the corners 111-2,211-2,311-1, and 411-1 of the display assemblies 100, 200, 300, and 400 that join at the center C.

In the following description, for brevity, a technical method of adjusting the second corner 111-2 of the front 100a of the first display assembly 100 and the first corner 411-1 of the front 400a of the fourth display assembly 400 will be explained as an example. In this case, the technical adjustment method may be equally applied to the second corner 211-2 of the front 200a of the second display assembly 200 and the first corner 311-1 of the front 300a of the front 300a of the third display assembly 300 and the levels of them may be simultaneously adjusted along with the second corner 111-2 of the front 100a of the first display assembly 100 and the first corner 411-1 of the front 400a of the fourth display assembly 400.

Referring to FIG. 16, the level adjustment device 30 may include at least two or more rotating magnets 33, at least two or more motors 34 corresponding to the rotating magnets 33, at least two or more range sensors 35 corresponding to the rotating magnets 33, and the controller 36.

The controller 36 may be electrically connected to the at least two or more motors 34 and the at least two or more range sensors 35 to electrically control the motors 34 and the range sensors 35.

The first motor 34a may be arranged inside the first extension 31a. The first range sensor 35a may be arranged at the first extension 31a to measure distance h1 between the front 100a of the first display assembly 100 and the bottom end of the first extension 31a.

The first rotating magnet 33a may be arranged inside the center portion 31e to be adjacent to the first extension 31a and may receive rotational force from the first motor 34a.

Based on the first direction Z, when the center of the level adjustment device 30 falls on the center C. the first rotating magnet 33a may be located above the first level adjuster 150 of the first display assembly 100.

The second motor 34b may be arranged inside the second extension 31b. The second range sensor 35b may be arranged at the second extension 31b to measure distance h2 between the front 400a of the fourth display assembly 400 and the bottom end of the first extension 31b.

The second rotating magnet 33b may be arranged inside the center portion 31e to be adjacent to the second extension 31b and may receive rotational force from the second motor 34b.

Based on the first direction Z, when the center of the level adjustment device 30 falls on the center C, the second rotating magnet 33b may be located above the second level adjuster 450 of the fourth display assembly 400.

Alternatively, the first and second range sensors 35a and 35b may be arranged inside the center portion 31e as long as the first and second range sensors 35a and 35b are arranged above the first and fourth display devices 100 and 400, respectively, when the center of the level adjustment device 30 falls on the center C in the first direction Z.

Furthermore, as for the first and second motors 34a and 34b, the first and second motors 34a and 34b may be arranged inside the center portion 31e as long as the first and second motors 34a and 34b may be arranged above the first and second level adjusters 150 and 450 of the first and fourth display assemblies 100 and 400, respectively, when the center of the level adjustment device 30 falls on the center C in the first direction Z.

As described above, when the user places the level adjustment device 30 on the display device 10 such that the center of the level adjustment device 30 falls on the center C in the first direction Z, the first and second rotating magnets 33a and 33b of the level adjustment device 30 may transmit magnetic force to the first and second level adjusters 150 and 450, respectively.

Accordingly, the levels in the first direction Z of the fronts 100a and 400a of the first and fourth display assemblies 100 and 400 may be simultaneously adjusted by the level adjustment device 30.

Although not shown, the levels in the first direction Z of the fronts 200a and 300a of the second and third display assemblies 200 and 300 may also be simultaneously adjusted by the level adjustment device 30.

How the level adjustment device 30 works will now be described.

When the user places the level adjustment device 30 on the display device 10 such that the center of the level adjustment device 30 falls on the center C in the first direction Z, and powers on the level adjustment device 30, the controller 36 may drive the first and second range sensors 35a and 35b.

The first range sensor 35a may then measure the distance h1 in the first direction Z between the front 100a of the first display assembly 100 and the bottom end of the first extension 31a.

The second range sensor 35b may also measure the distance h2 in the first direction Z between the front 400a of the fourth display assembly 400 and the bottom end of the second extension 31b.

Values of the distances h1 and h2 measured by the respective range sensors 35a and 35b may be sent to the controller 36.

As shown in FIG. 16, when the front 400a of the fourth display assembly 400 protrudes upward from the front 100a of the first display assembly 100 by certain length l in the first direction Z, h1 may be measured to be larger than h2.

The controller 36 may then determine that the front 100a of the first display assembly 100 is located farther from the level adjustment device 30 than the front 400a of the fourth display assembly 400 in the first direction Z.

On receiving the values of h1 and h2 measured by the range sensors 35a and 35b, respectively, the controller 36 may control driving of the respective motors 34.

For example, when determining that h1 is larger than h2, the controller 36 may drive the first motor 34a without driving the second motor 34b.

Accordingly, the first rotating magnet 33a is rotated, and the first level adjuster 150 engaged with the first rotating magnet 33a may be operated such that the level of the front 100a of the first display assembly 100 rises up in the first direction Z.

The controller 36 may receive the values of h1 and h2 measured by the range sensors 35a and 35b in real time.

The first rotating magnet 33a may be rotated by the controller 36, and accordingly, the distance h1 in the first direction Z between the front 100a of the first display assembly 100 and the bottom end of the first extension 31a may be gradually reduced.

When the distance h1 is equal to the distance h2, the controller 36 may stop driving the first motor 34a.

Specifically, the controller 36 may keep controlling the first motor 34a or the second motor 34b to be driven until the distances h1 and h2 measured by the first and second range sensors 35a and 35b become equal to each other. When the distances h1 and h2 measured by the first and second range sensors 35a and 35b become equal to each other, the controller 36 may control the first motor 34a or the second motor 34b to be stopped.

As such, the level adjustment device 30 may receive respective values of the distances measured by the range sensors 35, and control the motors 34 to drive the level adjusters of the display assemblies 100, 200, 300, and 400 until the received distance values become equal to each other.

Alternatively, when each of the distance values h1 and h2 measured by the first and second range sensors 35a and 35b, respectively, is different from a preset value, the controller 36 may drive the first motor 34a and the second motor 34b until the distance value h1 or h2 becomes equal to the present value.

That is, the controller 36 may compare the distance values h1 and h2 measured by the first and second range sensors 35a and 35b, respectively, with each other to drive the first and second motors 34a and 34b, or may compare each of the distance values h1 and h2 measured by the first and second range sensors 35a and 35b, respectively, with a preset value to drive the first and second motors 34a and 34b.

Although not shown, in this case, values measured by range sensors 35 arranged on the second and third display assemblies 200 and 300, respectively, in the first direction Z may be sent to the controller 36, which may in turn drive the four motors 34 to make all the values measured by the four range sensors be equal.

According to embodiments of the disclosure, with a rotating magnet of a level adjustment device and a rotating magnet of a level adjuster engaged with each other, front levels of display assemblies may be easily aligned.

As the rotating magnet of the level adjuster may be rotated in a different direction from a magnet coupling direction between a display module of a display assembly and a supporter and the rotational force is transmitted to a worm gear, the display assembly may be easily moved with a minimum rotational force.

The level adjustment device and the level adjuster may work together while being separated. so that the front level of the display assembly may be easily adjusted even while a screen of the display assembly is activated.

Several embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:

1. A display device comprising:
   a display module including a display panel facing forward in a first direction, and
   a supporter magnetically coupled with the display module and supporting the display module,
   wherein the display module further includes
      a rotating magnet that is rotatable about a rotation axis extending in a second direction perpendicular to the first direction, and is engageable with an external magnet via magnetic force to cause the rotating magnet to rotate about the rotation axis, and
      an adjustment member that translates in the first direction or a third direction opposite to the first direction due to the rotation of the rotating magnet caused by the engagement with the external magnet, to adjust a distance between the display module and the supporter and thereby adjust a level of the display panel in the first direction.

2. The display device of claim 1,
   wherein the display module further includes a coupling magnet to magnetically couple the supporter to the display module, and the coupling magnet provides sufficient magnetic coupling so that the supporter and the display module remain magnetically coupled while the adjustment member translates.

3. The display device of claim 2, wherein, when the adjustment member translates in the third direction, the adjustment member pushes the supporter in the third direction to thereby increase the distance between the display module and the supporter.

4. The display device of claim 1, wherein
the display module includes a worm gear transmitting rotational force of the rotating magnet to the adjustment member,
the worm gear includes a worm rotated along with the rotating magnet around the rotation axis extending in the second direction, and a worm wheel interlocked with the worm and rotated around a rotation axis extending in the first direction, and
the adjustment member is rotationally coupled with the worm wheel around the rotation axis extending in the first direction.

5. The display device of claim 4, wherein
the worm wheel is engaged and rotated with the worm when the rotating magnet is rotated, and
the adjustment member translates in the first direction or the third direction while being engaged with the rotation of the worm.

6. The display device of claim 5, wherein
the adjustment member translates in the first direction when the rotating magnet rotates in one direction, and
the adjustment member translates in the third direction when the rotating magnet rotates in a direction opposite to the one direction.

7. The display device of claim 5, wherein
the worm wheel includes a center portion on the rotation axis of the worm wheel, and teeth extending from the center portion and formed along a circumferential direction of the worm wheel, and
the adjustment member is rotationally inserted into the center portion.

8. The display device of claim 7, wherein
the center portion includes an insertion hole into which the adjustment member is inserted, and first threads formed on an inner circumferential surface of the insertion hole, and
the adjustment member includes a body inserted into the insertion hole, and second threads formed on an outer circumferential surface of the body to correspond to the first threads.

9. The display device of claim 1, wherein
the display module further includes a supporting frame having a surface supporting the display panel, and
the rotating magnet and the adjustment member are arranged on an opposite surface of the supporting frame than the display panel.

10. The display device of claim 9, wherein
the display module further includes a cover frame covering a rear side of the supporting frame, and coming into contact with the supporter when the display module is coupled with the supporter, and
the adjustment member passes through the cover frame to push the supporter in the third direction when translating in the third direction.

11. A display system comprising:
a level adjustment device including a first magnet rotatable about a first rotation axis; and
at least one display assembly, each display assembly of the at least one display assembly including
a display module having a display panel facing forward in a first direction, with the level adjustment device being positionable in front of the display panel so that the first rotation axis is perpendicular to the first direction, and
a supporter magnetically coupled with the display module and supporting the display module,
wherein the display module further includes
a second magnet that is rotatable about a second rotation axis extending in a direction perpendicular to the first direction, and, when the level adjustment device is positioned in front of the display panel, is engageable with the first magnet via magnetic force so that the rotation of the first magnet about the first rotation axis causes the second magnet to rotate about the second rotation axis, and
an adjustment member that translates in the first direction or a third direction opposite the first direction due to the rotation of the second magnet caused by the rotation of the first magnet, to adjust a distance between the display module and the supporter and thereby adjust a level of the display panel in the first direction.

12. The display system of claim 11, wherein
the display module further includes a coupling magnet t to magnetically couple the supporter to the display, and
the coupling magnet provides sufficient magnetic coupling so that the supporter and the display module remain magnetically coupled while the adjustment member translates.

13. The display system of claim 11, wherein the level adjustment device further includes
a motor to rotate the first magnet, and
a switch to control driving of the motor.

14. The display system of claim 13, wherein the level adjustment device further includes a stand to position the level adjustment device in front of the display panel on a corner of the display panel with the first rotation axis perpendicular to the first direction.

15. The display system of claim 11, wherein
the display module further includes a worm gear transmitting rotational force of the second magnet to the adjustment member,
the worm gear includes a worm rotated along with the second magnet around a third rotation axis extending in a direction perpendicular to the first direction, and a worm wheel interlocked with the worm and rotated around a fourth rotation axis extending in the first direction, and
the adjustment member is rotationally coupled with the worm wheel around the fourth rotation axis.

16. The display system of claim 15, wherein
the worm wheel is engaged and rotated with the worm when the second magnet is rotated, and
the adjustment member is moved in the first direction or the third direction while being engaged with the rotation of the worm.

17. The display system of claim 16, wherein
the translation of the level adjustment device in the first direction causes the adjustment member to be inserted into the display module when the second magnet is rotated in one direction, and
the translation of the level adjustment device in the third direction causes the adjustment member to protrude out of the display module when the second magnet is rotated in a direction opposite to the one direction.

18. The display system of claim 11, wherein the level adjustment device includes a range sensor to measure a distance between the display panel and the level adjustment device, and a controller configured to rotate the first magnet in accordance with the measured distance.

19. The display system of claim 18, wherein
the at least one display assembly includes a first display assembly and a second display assembly arranged to be adjacent to the first display assembly in a direction perpendicular to the first direction,
the range sensor measures distances from the range sensor to the first and second display assemblies, and
the controller rotates the first magnet so that the distances from the range sensor to the first and second display assemblies become equal, when the distances from the range sensor to the first and second display assemblies are different.

20. A display device comprising:
a level adjustment device; and
first and second display assemblies, each including
  a display module including a display panel facing forward in a first direction, and
  a supporter magnetically coupled with the display module and supporting the display module, wherein the display module further includes
    a magnet that is rotatable about a rotation axis extending in a second direction perpendicular to the first direction, and is engageable with the level adjustment device via magnetic force to cause the magnet to rotate about the rotation axis, and
    an adjustment member that translates in the first direction or a third direction opposite to the first direction due to the rotation of the magnet caused by the engagement of the magnet with the level adjustment device, to adjust a distance between the display module and the supporter and thereby adjust a level of the display panel in the first direction,
the first and second display assemblies are adjacent to each other in a direction perpendicular to the first direction, and
the level adjustment device is thereby configured to adjust the level of the display panel of the first display assembly in the first direction and/or the level of the display panel of the second display assembly in the first direction so that the display panels of the first and second display assemblies are aligned at the same level in the first direction.

* * * * *

UNITED STATES PATENT AND TRADEMARK OFFICE
CERTIFICATE OF CORRECTION

PATENT NO. : 11,528,815 B2
APPLICATION NO. : 16/879056
DATED : December 13, 2022
INVENTOR(S) : Jaeneung Lee et al.

It is certified that error appears in the above-identified patent and that said Letters Patent is hereby corrected as shown below:

In the Claims

Column 22, Line 21:
In Claim 12, delete "magnet t to" and insert --magnet to--.

Signed and Sealed this
Twenty-first Day of February, 2023

Katherine Kelly Vidal
*Director of the United States Patent and Trademark Office*